(12) United States Patent
Ohmi et al.

(10) Patent No.: US 6,669,825 B2
(45) Date of Patent: Dec. 30, 2003

(54) METHOD OF FORMING A DIELECTRIC FILM

(75) Inventors: Tadahiro Ohmi, 1-17-301, Komegafukuro 2-Chome, Aoba-Ku, Sendai-Shi, Miyagi 980-0813 (JP); Shigetoshi Sugawa, Sendai (JP)

(73) Assignee: Tadahiro Ohmi, Sendai (JP)

( * ) Notice: Subject to any disclaimer, the term of this patent is extended or adjusted under 35 U.S.C. 154(b) by 0 days.

(21) Appl. No.: 09/867,767

(22) Filed: May 31, 2001

(65) Prior Publication Data

US 2002/0040847 A1 Apr. 11, 2002

Related U.S. Application Data

(63) Continuation of application No. PCT/JP01/01966, filed on Mar. 13, 2001.

(51) Int. Cl.[7] .......................... C23C 14/34; B05D 3/00; H05H 1/22
(52) U.S. Cl. .................. 204/192.12; 427/350; 427/331; 427/444; 427/553; 427/569; 427/573
(58) Field of Search ..................... 204/192.12; 427/350, 427/331, 444, 553, 569, 573

(56) References Cited

U.S. PATENT DOCUMENTS

| 5,672,252 A | 9/1997 | Hayashi et al. ......... 204/192.22 |
| 6,333,558 B1 * | 12/2001 | Hasegawa ................... 257/759 |

FOREIGN PATENT DOCUMENTS

| JP | 04092423 A | 5/1992 | ......... H01L/21/316 |
| JP | 09064307 A | 3/1997 | ......... H01L/27/108 |
| JP | 2000091589 A | 3/2000 | ......... H01L/29/286 |
| JP | 2000106439 A | 4/2000 | ......... H01L/29/786 |
| JP | 2000156373 A | 6/2000 | ........... H01L/21/31 |
| JP | 2001015507 A | 1/2001 | ........... H01L/21/38 |

OTHER PUBLICATIONS

English translation of JP 9–64307.*

* cited by examiner

*Primary Examiner*—Steven H. VerSteeg
(74) *Attorney, Agent, or Firm*—Pillsbury Winthrop LLP

(57) ABSTRACT

A method of forming an insulation film includes the steps of forming an insulation film on a substrate, and modifying a film quality of the insulation film by exposing the insulation film to atomic state oxygen O* or atomic state hydrogen nitride radicals NH* formed with plasma that uses Kr or Ar as inert gas.

13 Claims, 28 Drawing Sheets

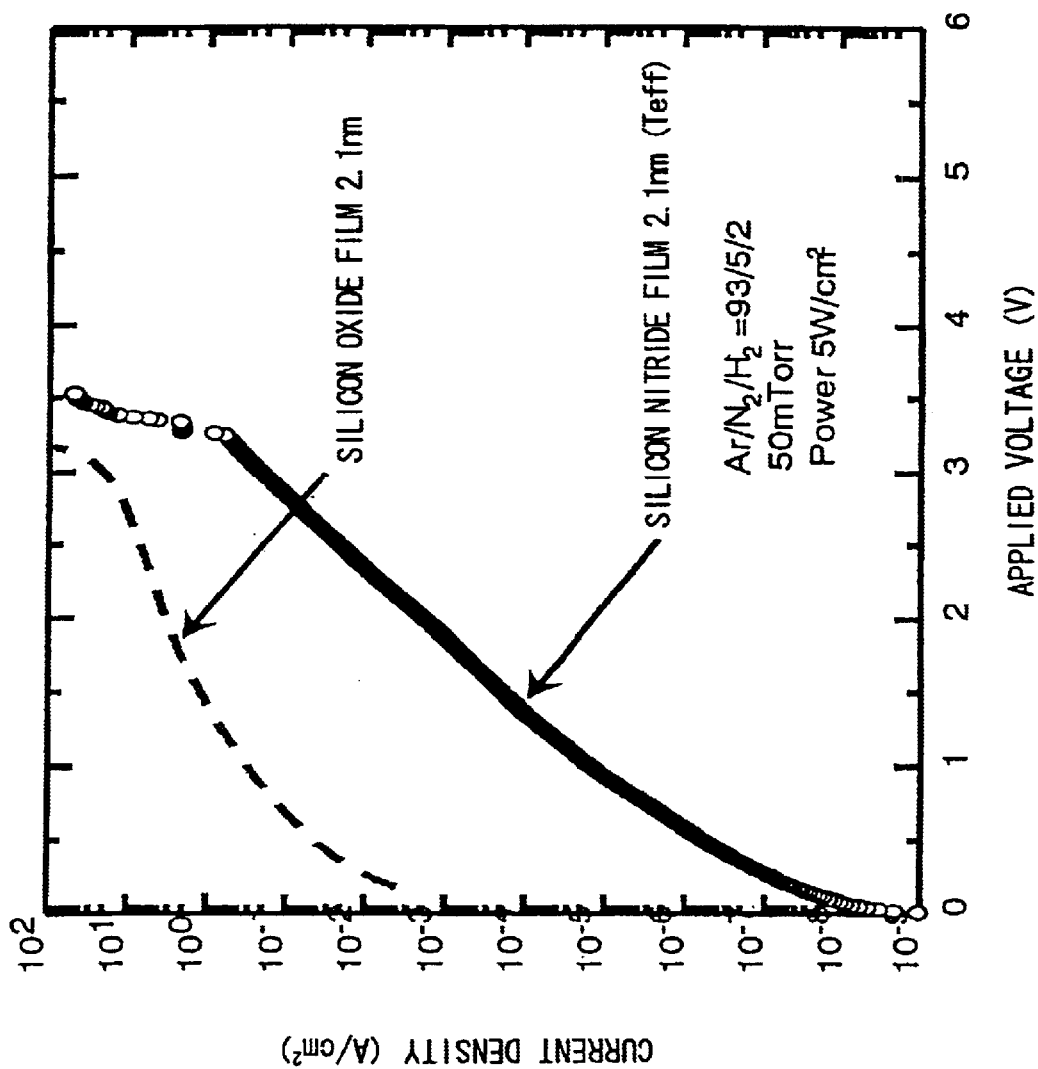

FIG. 11A
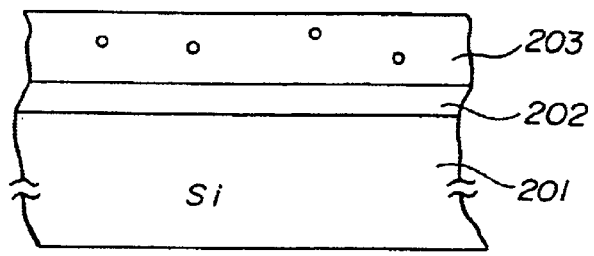
FIG. 11B
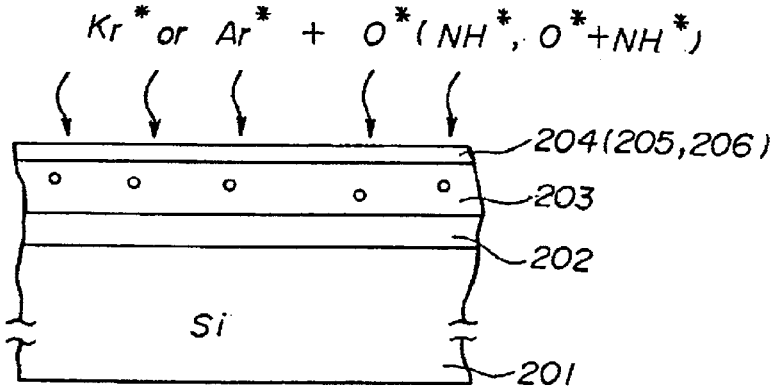
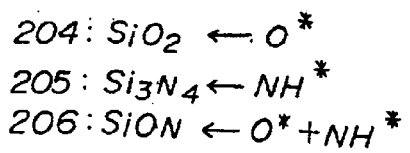

METHOD OF FORMING A DIELECTRIC FILM

RELATED APPLICATIONS

This is a continuation of aapplication No. PCT/JP01/01966, filed Mar. 13, 2001.

BACKGROUND

The inventions described herein generally relate to semiconductor devices and a fabrication processes thereof. More particularly, the inventions relate to a forming an insulation film and fabrication process of a non-volatile semiconductor memory device capable of rewriting information electrically, including a flash memory device.

There are various volatile memory devices such as DRAMs and SRAMs. Further, there are non-volatile memory devices such as a mask ROM, PROM, EPROM, EEPROM, and the like. Particularly, a flash memory device is an EEPROM having a single transistor for one memory cell and has an advantageous feature of small cell size, large storage capacity and low power consumption. Thus, intensive efforts are being made on the improvement of flash memory devices. In order that a flash memory device can be used stably over a long interval of time with low voltage, it is essential to use a uniform insulation film having high film quality.

Further, high-quality insulation film, characterized by uniform film quality and low leakage current, is important not only in a flash memory device but also in other various semiconductor devices that uses a capacitor, including a ferroelectric semiconductor memory device that uses a ferroelectric film. Further, a high dielectric film of uniform film quality characterized by small leakage current is important as a gate insulation film of a high-speed semiconductor device having a gate length of 0.1 $\mu$m or less.

First, the construction of a conventional flash memory device will be explained with reference to FIG. 1 showing the concept of a generally used flash memory device having a so-called stacked gate structure.

Referring to FIG. 1, the flash memory device is constructed on a silicon substrate 1700 and includes a source region 1701 and a drain region 1702 formed in the silicon substrate 1700, a tunneling gate oxide film 1703 formed on the silicon substrate 1700 between the source region 1701 and the drain region 1702, and a floating gate 1704 formed on the tunneling gate oxide film 1703, wherein there is formed a consecutive stacking of a silicon oxide film 1705, a silicon nitride film 1706 and a silicon oxide film 1707 on the floating gate 1704, and a control gate 1708 is formed further on the silicon oxide film 1707. Thus, the flash memory of such a stacked structure includes a stacked structure in which the floating gate 1704 and the control gate 1708 sandwich an insulating structure formed of the insulation films 1705, 1706 and 1707 therebetween.

The insulating structure provided between the floating gate 1704 and the control gate 1705 is generally formed to have a so-called ONO structure in which the nitride film 1706 is sandwiched by the oxide films 1705 and 1707 for suppressing the leakage current between the floating gate 1704 and the control gate 1705. In an ordinary flash memory device, the tunneling gate oxide film 1703 and the silicon oxide film 1705 are formed by a thermal oxidation process, while the silicon nitride film 1706 and the silicon oxide film 1707 are formed by a CVD process. The silicon oxide film 1705 may be formed by a CVD process. The tunneling gate oxide film 1703 has a thickness of about 8 nm, while the insulation films 1705, 1706 and 1707 are formed to have a total thickness of about 15 nm in terms of oxide equivalent thickness. Further, a low-voltage transistor having a gate oxide film of 3–7 nm in thickness and a high-voltage transistor having a gate oxide film of 15–30 nm in thickness are formed on the same silicon in addition to the foregoing memory cell.

In the flash memory cell having such a stacked structure, a voltage of about 5–7V is applied for example to the drain 1702 when writing information together with a high voltage larger than 12V applied to the control gate 1708. By doing so, the channel hot electrons formed in the vicinity of the drain region 1702 are accumulated in the floating gate via the tunneling insulation film 1703. When erasing the electrons thus accumulated, the drain region 1702 is made floating and the control gate 1708 is grounded. Further, a high voltage larger than 12 V is applied to the source region 1701 for pulling out the electrons accumulated in the floating gate 1704 to the source region 1701.

Such a conventional flash memory device, on the other hand, requires a high voltage at the time of writing or erasing of information, while the use of such a high voltage tends to cause a large substrate current. The large substrate current, in turn, causes the problem of deterioration of the tunneling insulation film and hence the degradation of device performance. Further, the use of such a high voltage limits the number of times rewriting of information can be made in a flash memory device and also causes the problem of erroneous erasing.

The reason a high voltage has been needed in conventional flash memory devices is that the ONO film, formed of the insulation films 1705, 1706 and 1707, has a large thickness.

In the conventional art of film formation, there has been a problem, when a high-temperature process such as thermal oxidation process is used in the process of forming an oxide film such as the insulation film 1705 on the floating gate 1704, in that the quality of the interface between the polysilicon gate 1704 and the oxide film tends to become poor due to the thermal budget effect, etc. In order to avoid this problem, one may use a low temperature process such as CVD process for forming the oxide film. However, it has been difficult to form a high-quality oxide film according to such a low-temperature process. Because of this reason, conventional flash memory devices had to use a large thickness for the insulation films 1705, 1706 and 1707 so as to suppress the leakage current.

However, the use of large thickness for the insulation films 1705, 1706 and 1707 in these conventional flash memory devices has caused the problem in that it is necessary to use a large writing voltage and also a large erasing voltage. As a result of using large writing voltage and large erasing voltage, it has been necessary to form the tunneling gate insulation film 1703 with large thickness so as to endure the large voltage used.

Thus, there is a need of a high-quality insulation film that provides small leakage current even in the case the insulation film has a small thickness, wherein the need of such a high-quality insulation film is not limited to flash memory devices but also in other various semiconductor devices.

SUMMARY

In general the inventions provide novel and useful arrangements and methods of forming a dielectric film wherein the foregoing problems are eliminated.

More specifically, the inventions provide a method of forming a high-quality oxide film, nitride film or oxynitride film in which reduction of film thickness is possible without causing substantial leakage current.

Also, the inventions provide a method of forming an oxide film characterized by the steps of:

forming an oxide film on a substrate; and modifying a film quality of said oxide film formed on said substrate by exposing said oxide film to atomic state oxygen O*.

According to the inventions, the atomic state oxygen O* penetrate easily into the oxide film formed on the substrate and terminate dangling bonds or weak bonds in the oxide film. As a result, an $SiO_2$ film formed by a process such as a CVD process can have a quality similar to that of a thermal oxide film as a result of exposure to the atomic state oxygen O*. Thus, the oxide film formed according to the present invention has various advantageous features such as small number of surface states, having a composition substantially identical with a stoichiometric composition, small leakage current, and the like. It should be noted that the atomic state oxygen O* can be formed efficiently by microwave excitation of a mixed gas of Kr and oxygen.

The inventions also provide a method of forming a nitride film that enables improvement of existing nitride film quality.

The inventions also provide a method of forming a nitride film, including:

forming a nitride film on a substrate; and modifying a film quality of said nitride film formed on said substrate by exposing hydrogen nitride radicals NH*.

Hydrogen nitride radicals NH* penetrate easily into the nitride film formed on the substrate and compensates for defects in the nitride film. As a result, the nitride film has a near-stoichiometric composition of $Si_3N_4$ after the processing, and is characterized by small number of surface states and small leakage current. Further, there occurs relaxation of stress in the silicon nitride film thus processed. It should be noted that the hydrogen nitride radicals NH* are formed efficiently by microwave excitation of a mixed gas of Kr and oxygen.

The inventions also provide methods of forming an oxide film on a substrate by depositing the oxide film on the substrate by a CVD process, while simultaneously processing the deposited oxide film by atomic state oxygen formed in plasma.

The inventions also provide a method of forming an oxide film, including:

forming plasma in a processing chamber by introducing an inert gas of Kr or Ar and an oxygen gas into said processing chamber and causing microwave excitation therein;

causing a deposition of an oxide film on a substrate in said processing chamber by introducing a processing gas into said processing chamber and by causing activation of said processing gas by said plasma, said oxide film being processed by atomic state oxygen O* formed in said plasma simultaneously to deposition.

The inventions also provide a method of forming a nitride film on a substrate by depositing the nitride film on the substrate by a CVD process, while simultaneously processing the nitride film thus deposited by hydrogen nitride radicals formed in plasma.

The inventions also provide a method of forming a nitride film including:

forming plasma in a processing chamber by introducing thereto an inert gas of Kr or Ar and a gas containing nitrogen and hydrogen and causing microwave excitation therein; and depositing a nitride film on a substrate in said processing chamber by introducing a processing gas into said processing chamber and by causing activation of said processing gas by said plasma, said silicon nitride film being processed by hydrogen nitride radicals NH* in said plasma simultaneously to deposition.

The inventions also provide a method of forming an oxynitride film on a substrate by depositing the oxynitride film on the substrate by a CVD process, while simultaneously processing the oxynitride film thus deposited by atomic state oxygen and hydrogen nitride radicals formed in plasma.

The inventions also provide a method of forming an oxynitride film, characterized by the steps of:

forming plasma in a processing chamber by introducing an inert gas of Kr or Ar, an oxygen gas, and a gas containing nitrogen and hydrogen into said processing chamber and causing microwave excitation therein;

depositing an oxynitride film on a substrate by introducing a processing gas into said processing chamber and by causing activation of said processing gas by said plasma, said oxynitride film being processed by atomic state oxygen and hydrogen nitride radicals formed in said plasma simultaneously to deposition.

The inventions also provide a method of forming an oxide film on a substrate by depositing the oxide film on the substrate by a sputtering process, while simultaneously processing the oxide film thus deposited by atomic state oxygen formed in plasma.

The inventions also provide a method of sputtering an oxide film, including:

depositing an oxide film on a substrate in a processing chamber by a sputtering of a target;

forming plasma in said processing chamber by causing microwave excitation of an inert gas of Kr or Ar and an oxygen gas; and processing said oxide film by atomic state oxygen O* formed in said plasma.

The inventions also provide a method of forming a nitride film on a substrate by depositing the nitride film by a sputtering process, while simultaneously processing the deposited nitride film by hydrogen nitride radicals formed in plasma.

The inventions also provide a sputtering method of an oxide film, characterized by the steps of:

depositing a nitride film on a substrate in a processing chamber by a sputtering of a target;

forming plasma in said processing chamber by microwave excitation of an inert gas of Kr or Ar and a gas containing nitrogen and hydrogen; and processing said nitride film by hydrogen nitride radicals formed in said plasma.

The inventions also provide a method of forming an oxynitride film on a substrate by depositing the oxynitride film on the substrate by a sputtering process, while simultaneously processing the oxynitride film thus deposited by atomic state oxygen and hydrogen nitride radicals formed in plasma.

The inventions also provide a sputtering method of an oxynitride film, including:

depositing an oxynitride film on a substrate by a sputtering of a target;

forming plasma in said processing chamber by microwave excitation of an inert gas of Kr or Ar, an oxygen gas, and a gas containing nitrogen and hydrogen; and processing said oxynitride film by atomic state oxygen O* and hydrogen nitride radicals NH* formed in said plasma.

The inventions also provide a gate insulation film on a substrate by stacking a nitride film and a high dielectric film.

The inventions also provide a method of forming a gate insulation film on a substrate, including:

forming a nitride film on a surface of a substrate;

processing said nitride film by hydrogen nitride radicals NH*;

depositing a high dielectric film on said processed nitride film; and forming a nitride film by processing a surface of said high dielectric film by hydrogen nitride radicals NH*.

The inventions also provide a method of forming a gate insulation film on a substrate, including:

forming an oxynitride film on a substrate;

processing said oxynitride film by hydrogen nitride radicals NH* and atomic state oxygen O*;

depositing a high dielectric film on said processed oxynitride film; and forming a nitride film by processing a surface of said high dielectric film by hydrogen nitride radicals NH*.

Other advantages and features of the inventions will become apparent from the following detailed description when read in conjunction with the attached drawings.

BRIEF DESCRIPTION OF THE DRAWINGS

FIG. 10 is a diagram showing the current-voltage characteristic of the silicon nitride film according to the second embodiment of the present invention;

FIGS. 11A and 11B are diagrams showing the oxidation process, nitriding process and oxy-nitriding process of a polysilicon film according to a third embodiment of the present invention;

DETAILED DESCRIPTION

Hereinafter, embodiments of the present invention will be described.

[First Embodiment]

First, low temperature oxide film formation using plasma will be described.

Figure 2:
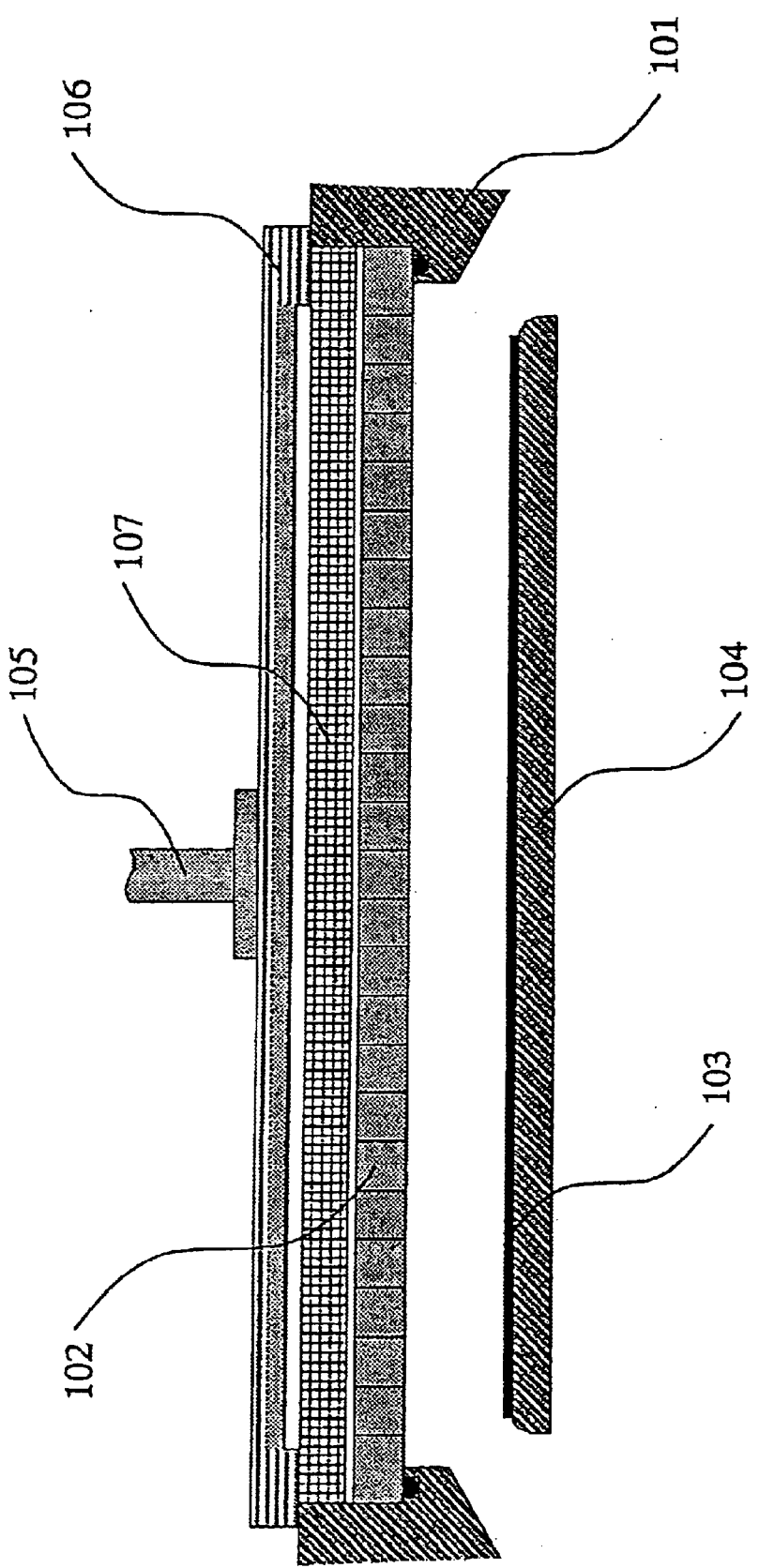
FIG. 2 is a diagram showing the concept of the plasma apparatus that uses a radial line slot antenna.

FIG. 2 is a cross-sectional diagram showing the construction of an exemplary microwave plasma processing apparatus used in the present invention for realizing the oxidation process, wherein the microwave plasma processing apparatus uses a radial line slot antenna (see WO98/33362). The novel feature of the present embodiment is to use Kr as the plasma excitation gas at the time of forming the oxide film.

Referring to FIG. 2, the microwave plasma processing apparatus includes a vacuum vessel (processing chamber) 101 accommodating therein a stage 104 on which a substrate 103 to be processed is supported. The processing chamber 101 is evacuated to a vacuum state, and a Kr gas and an $O_2$ gas are introduced from a shower plate 102 formed at a part of the wall of the processing chamber 101 such the pressure inside the processing chamber is set to about 1 Torr. Further, a disk shaped substrate such as a silicon wafer is placed on the stage 104 as the foregoing substrate 103. The stage 104 includes a heating mechanism, and the temperature of the substrate 103 is set to about 400° C. It is preferable to set the temperature in the range of 200–550° C. As long as the temperature is set in this range, a similar result is obtained.

Next, a microwave of 2.45 GHz is supplied from an external microwave source via a coaxial wave guide 105 connected thereto, wherein the microwave thus supplied is radiated into the processing chamber 101 by the radial line slot antenna 106 through a dielectric plate 107. As a result, there is formed high density plasma in the processing chamber 101. As long as the frequency of the microwave is in the range of 900 MHz or more but not exceeding 10 GHz, a similar result is obtained as described below. In the illustrated example, the distance between the shower plate 102 and the substrate 103 is set to about 6 cm. Narrower the distance, faster the film forming process.

In the microwave plasma processing apparatus of FIG. 2, it becomes possible to realize a plasma density exceeding 1. times $10^{12}$ cm$^{-3}$ at the surface of the substrate 103. Further, the high density plasma thus formed by microwave excitation has a low electron temperature, and a plasma potential of 10 V or less is realized at the surface of the substrate 103. Thus, the problem of the substrate 103 being damaged by the plasma is positively eliminated. Further, there occurs no problem of contamination of the substrate 103 because of the absence of plasma sputtering in the processing chamber 101. Because of the fact that the plasma processing is conducted in a narrow space between the shower plate 102 and the substrate 103, the product material of the reaction flows quickly in the lateral direction to a large volume space surrounding the stage 104 and is evacuated. Thereby, a very uniform processing is realized.

In the high density plasma in which a Kr gas and an $O_2$ gas are mixed, Kr* at the intermediate excitation state cause collision with the $O_2$ molecules and there occurs efficient formation of atomic state oxygen O*, and the atomic state oxygen O* thus formed cause oxidation of the substrate surface. It should be noted that oxidation of a silicon surface has conventionally been conducted by using $H_2O$ or $O_2$ molecules at very high process temperature such as 800° C. or more. In the case of using atomic state oxygen, on the other hand, it becomes possible to carry out the oxidation process at a low temperature of 550° C. or less.

It should be noted that the modification processing of oxide film of the present invention can be conducted at a low temperature of 550° C. or lower, and it becomes possible to recover the oxygen defects without causing hydrogen atoms terminating the dangling bonds in the oxide film. This applies also to the case of formation of a nitride film or an oxynitride film to be described later.

In order to increase the chance of collision between K* and $O_2$, it is preferable to increase the pressure in the processing chamber 101. On the other hand, the use of too high pressure in the processing chamber increases the chance that O* causing collision with another O* and returning to the $O_2$ molecule. Thus, there would exist an optimum gas pressure.

Figure 3:
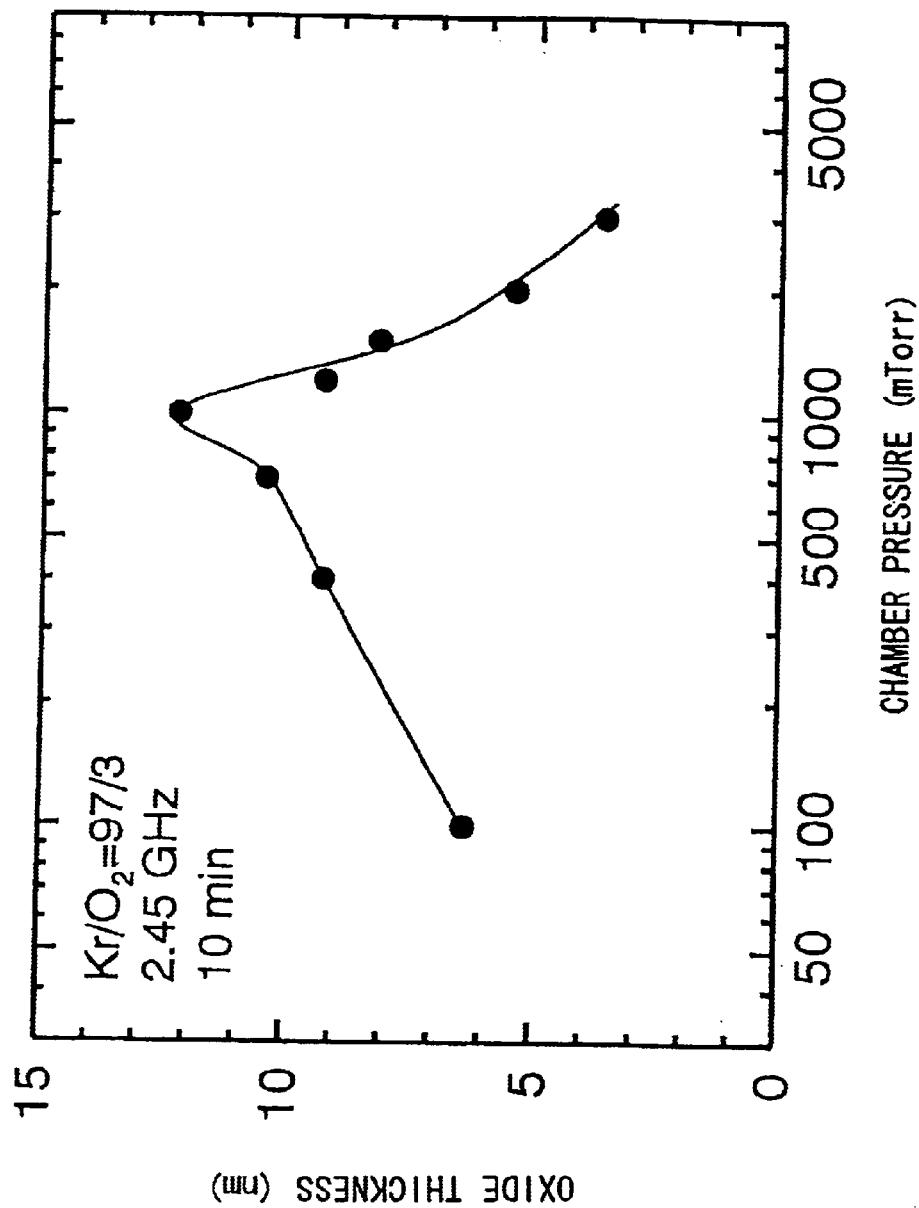
FIG. 3 is a diagram showing the relationship between a thickness and a gas pressure in a processing chamber for an oxide film formed according to a first embodiment of the present invention.

FIG. 3 shows the thickness of the oxide film for the case in which the total pressure inside the processing chamber 101 is changed while maintaining the Kr and oxygen pressure ratio such that the proportion of Kr is 97% and the proportion of oxygen is 3%. In the experiment of FIG. 3, it should be noted that the silicon substrate was held at 400° C. and the oxidation was conducted over the duration of 10 minutes.

Referring to FIG. 3, it can be seen that the thickness of the oxide film becomes maximum when the total gas pressure in the processing chamber 101 is set to 1 Torr, indicating that the oxidation process becomes optimum under this pressure or in the vicinity of this pressure. Further, it should be noted that this optimum pressure remains the same in the case the silicon substrate has the (100) oriented surface and also in the case the silicon substrate has the (111) oriented surface.

Figure 4:
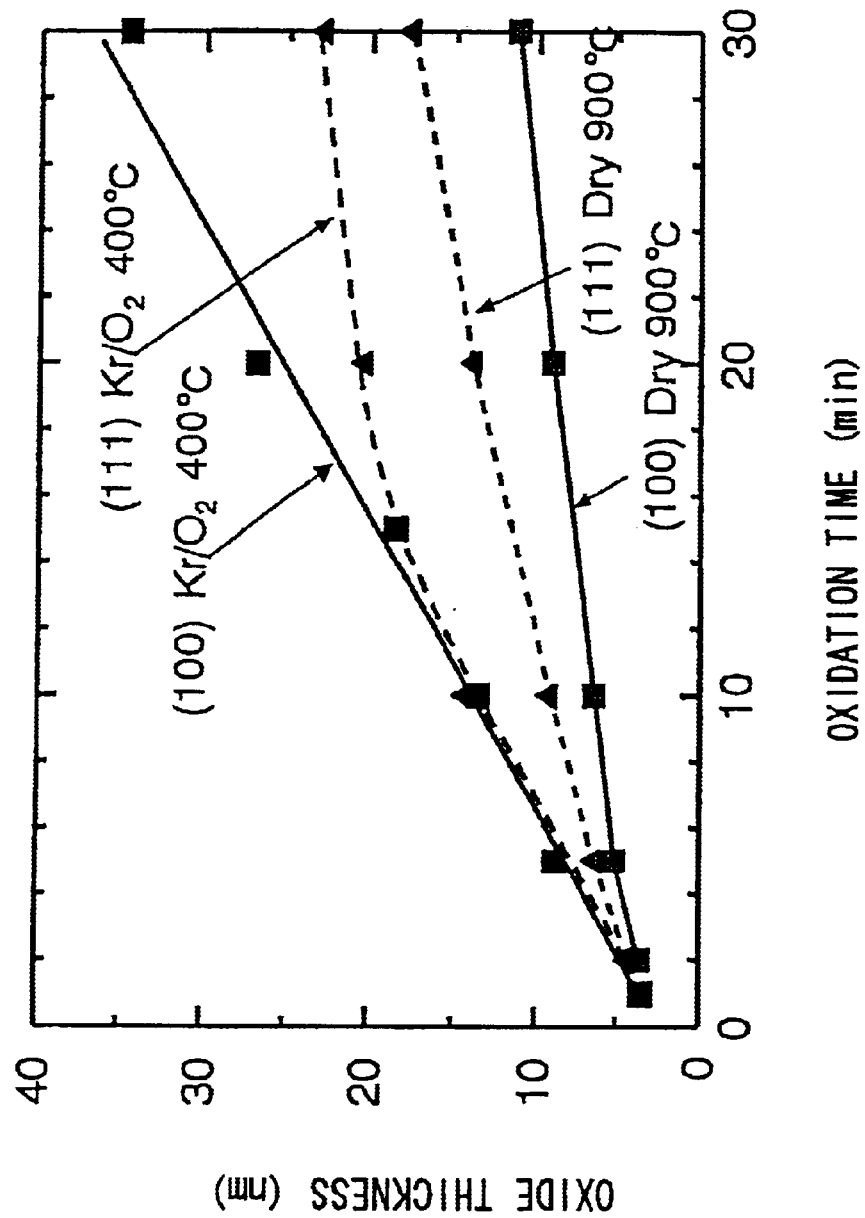
FIG. 4 is a diagram showing the relationship between the thickness and duration of oxidation for the oxide film formed according to the first embodiment of the present invention.

FIG. 4 shows the relationship between the thickness of the oxide film and the duration of the oxidation processing for the oxide film that is formed by oxidation of the silicon substrate surface using the Kr/$O_2$ high density plasma. In FIG. 4, the result for the case in which the silicon substrate has the (100) oriented surface and the result for the case in which the silicon substrate has the (111) oriented surface are both represented. Further, FIG. 4 also represents the oxidation time dependence for the case a conventional dry oxidation process at the temperature of 900° C. is employed.

Referring to FIG. 4, it can be seen that the oxidation rate caused by the Kr/$O_2$ high density plasma oxidation processing, conducted at the temperature of 400° C. under the chamber pressure of 1 Torr, is larger than the oxidation rate for a dry $O_2$ process conducted at 900° C. under the atmospheric pressure.

In the case of conventional dry thermal oxidation process at 900° C., it can oxidation process is used, on the other hand, this relationship is reversed and the growth rate of the oxide film on the (111) surface is smaller than the growth rate of the oxide film on the (100) surface. In view of the fact that silicon atoms are arranged with larger surface density on the (111) oriented surface than on the (100) oriented surface in a Si substrate, it is predicted that the oxidation rate should be smaller on the (111) surface than on the (100) surface as long as the supply rate of the oxygen radicals is the same. The result of the foregoing oxidation process of the silicon substrate surface is in good conformity with this prediction when the Kr/$O_2$ high density plasma is used for the oxidation process, indicating that there is formed a dense oxide film similar to the one formed on a (100) surface, also on the (111) surface. In the conventional case, on the other hand, the oxidation rate of the (111) surface is much larger than the oxidation rate of the (100) surface. This indicates that the oxide film formed on the (111) film would be sparse in quality as compared with the oxide film formed on the (100) surface.

Figure 5:
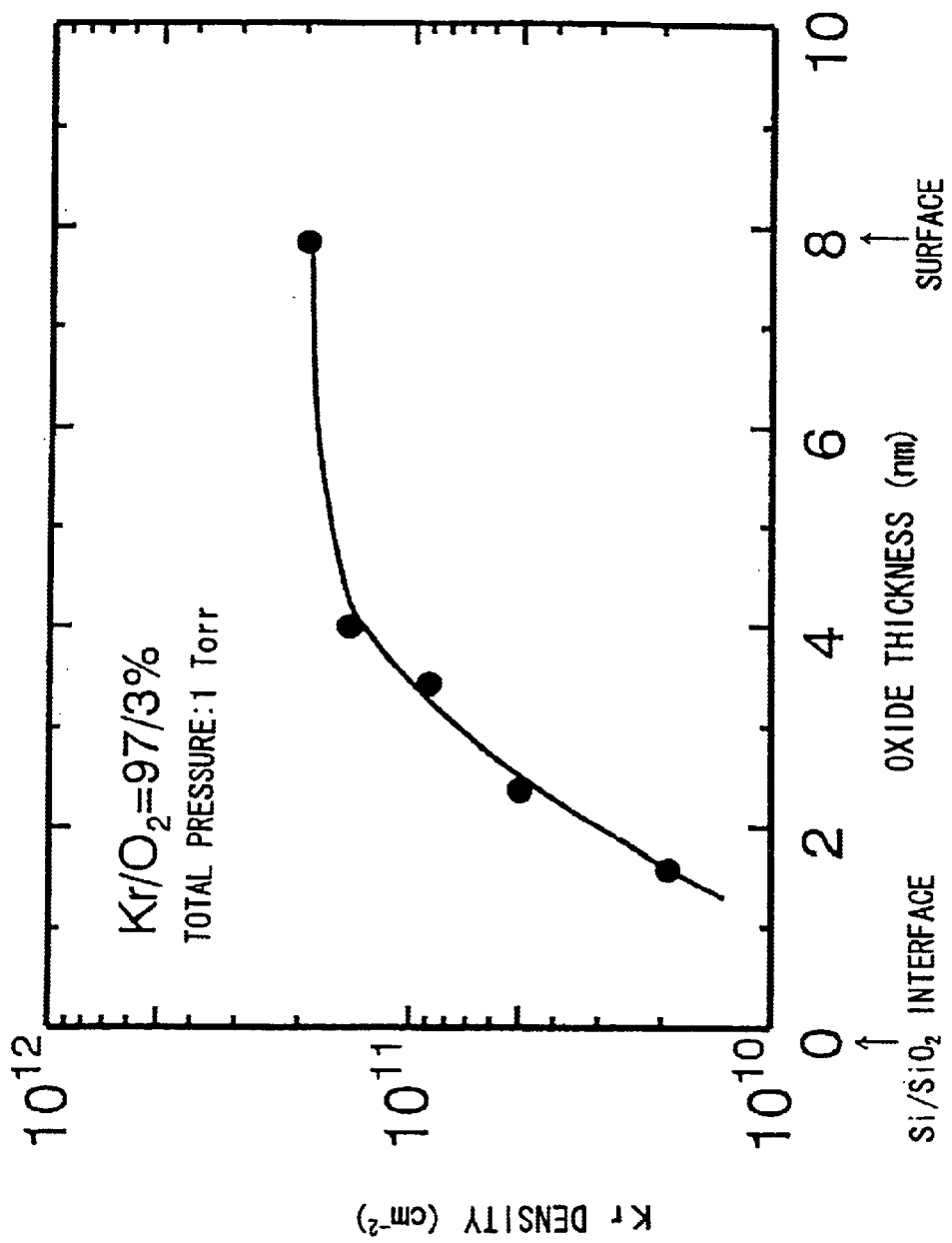
FIG. 5 is a diagram showing the depth profile of Kr density in the silicon oxide film according to the first embodiment of the present invention.

FIG. 5 shows the depth profile of the Kr density inside the silicon oxide film that is formed according to the foregoing process, wherein the depth profile FIG. 5 was obtained by a total-reflection fluorescent X-ray spectrometer. In the experiment of FIG. 5, the formation of the silicon oxide film was conducted at the substrate temperature of 400° C. while setting the oxygen partial pressure in the Kr gas to 3% and setting the pressure of the processing chamber to 1 Torr (about 133 Pa).

Referring to FIG. 5, it can be seen that the surface density of Kr decreases toward the silicon/silicon oxide interface, and a density of $2 \times 10^{11}$ cm$^{-2}$ is observed at the surface of the silicon oxide film. Thus, the result of FIG. 5 indicates that a substantially uniform Kr concentration is realized in the silicon oxide film when the silicon oxide film is formed by surface oxidation of a silicon substrate while using the Kr/$O_2$ high density plasma, provided that the silicon oxide film has a thickness of 4 nm or more. It can be seen that the Kr concentration in the silicon oxide film decreases toward the silicon/silicon oxide surface. According to the method of silicon oxide formation of the present invention, Kr is incorporated in the silicon oxide film with a surface density of $10^{10}$ cm² or more. The result of FIG. 5 is obtained on the (100) surface and also on the (111) surface.

Figure 6:
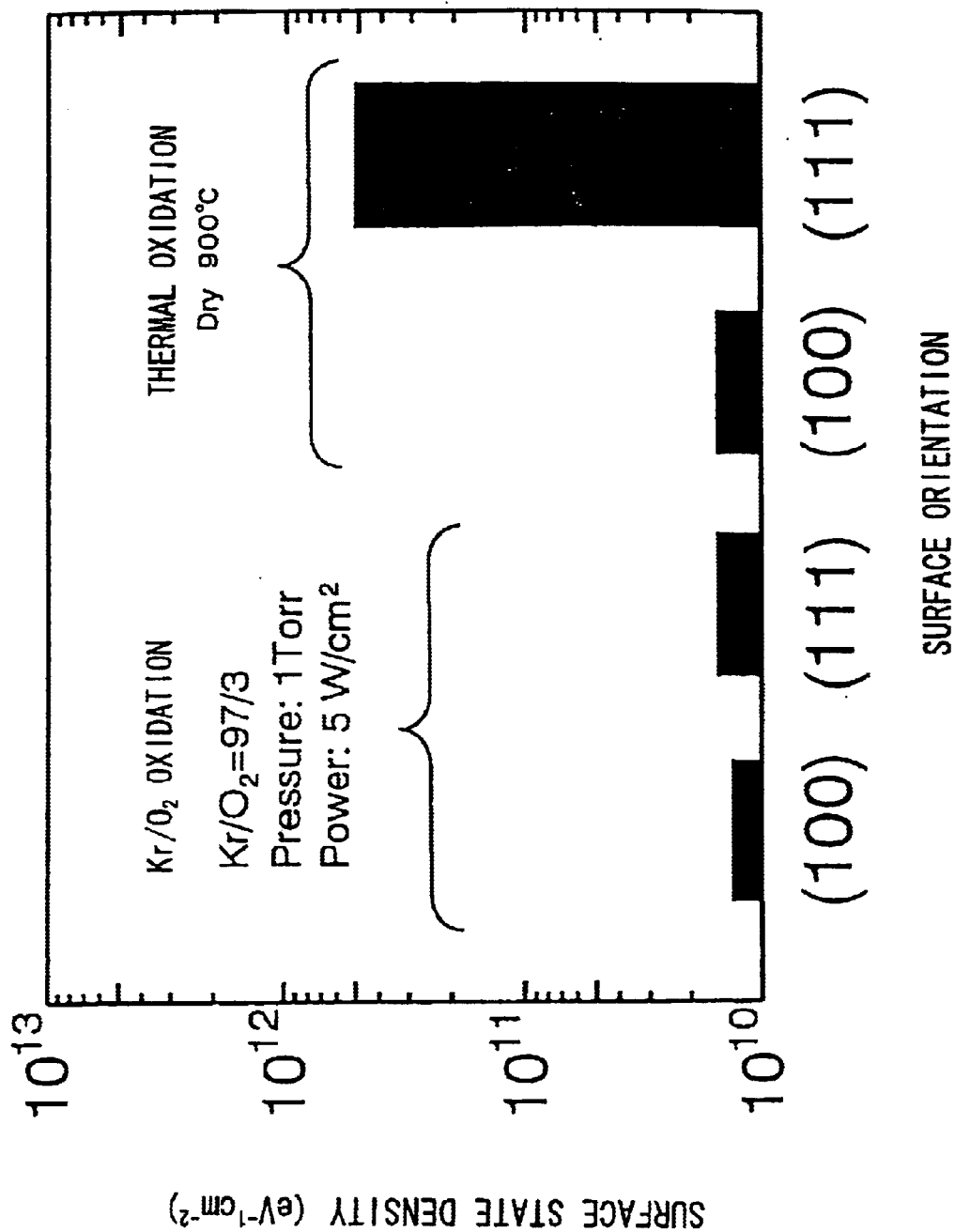
FIG. 6 is a diagram showing the surface state density in the silicon oxide film according to the first embodiment of the present invention.

FIG. 6 shows the surface state density formed in an oxide film, wherein the result of FIG. 6 was obtained by a low-frequency C-V measurement. The silicon oxide film of FIG. 6 was formed at the substrate temperature of 400° C. while using the apparatus of FIG. 2. In the experiment, the oxygen partial pressure in the rare gas was set to 3% and the pressure in the processing chamber was set to 1 Torr (about 133 Pa). For the sake of comparison, the surface state density of a thermal oxide film formed at 900° C. in a 100% oxygen atmosphere is also represented.

Referring to FIG. 6, it can be seen that the surface state density of the oxide film is small in both of the cases in which the oxide film is formed on the (100) surface and in which the oxide film is formed on the (111) surface as long as the oxide film is formed while using the Kr gas. The value of the surface state density thus achieved is comparable with the surface state density of a thermal oxide film that is formed on the (100) surface in a dry oxidation atmosphere at 900° C. Contrary to the foregoing, the thermal oxide film formed on the (111) surface has a surface state density larger than the foregoing surface state density by a factor of 10.

The mechanism of the foregoing results is thought as follows.

Viewing the silicon crystal from the side of the silicon oxide film, there appear two bonds for one silicon atom when the silicon surface is the (100) surface. On the other hand, there appear one bond and three bonds alternately for one silicon atom when the silicon surface is the (111) surface. Thus, when a conventional thermal oxidation process is applied to a (111) surface, oxygen atoms quickly cause bonding to all the foregoing three bonds, leaving the remaining bond behind the silicon atom. Thereby, the remaining bond may extend and form a weak bond or disconnected and form a dangling bond. When this is the case, there inevitably occurs an increase of surface state density.

When the high density plasma oxidation is conducted in the mixed gas of Kr and $O_2$, Kr* of the intermediate excitation state cause collision with $O_2$ molecules and there occurs efficient formation of atomic state oxygen O*, wherein the atomic state oxygen O* thus formed easily reach the weak bond or dangling bond noted before and form a new silicon-oxygen bond. With this, it is believed that the surface states are reduced also on the (111) surface.

In the experiment for measuring the relationship between the oxygen partial pressure in the Kr gas used for the atmosphere during the formation of the silicon oxide film and the breakdown voltage of the silicon insulation film thus formed, and further in the experiment for measuring the relationship between the oxygen partial pressure in the Kr gas and the surface state density in the silicon oxide film thus formed, it was confirmed that a generally same result is obtained for the case in which the silicon oxide film is formed on the (100) surface and for the case in which the silicon oxide film is formed on the (111) surface, and that the surface state density becomes minimum when the oxygen partial pressure in the Kr gas is set to 3%, provided that the silicon oxide film is formed by setting the pressure of the processing chamber to 1 Torr (about 133 Pa). Further, the breakdown voltage of the silicon oxide film becomes maximum when the oxygen partial pressure is set to about 3%. From the foregoing, it is derived that an oxygen partial pressure of 2–4% is preferable for conducting the oxidation process by using the Kr/$O_2$ mixed gas.

Figure 7:
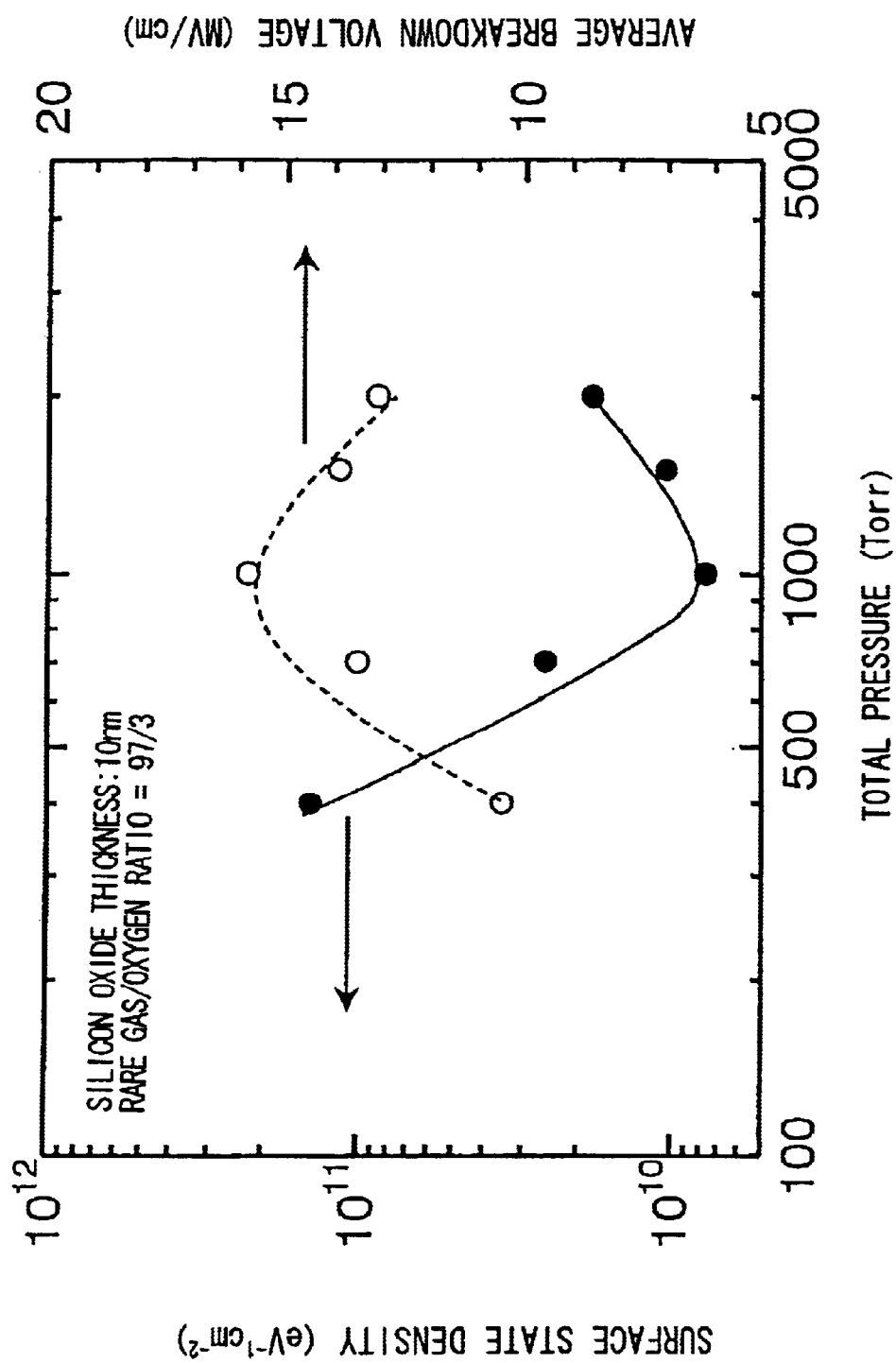
FIG. 7 is a diagram showing the relationship between the surface state density and the breakdown voltage for the silicon oxide film according to the first embodiment of the present invention.

FIG. 7 shows a relationship between the pressure used for forming the silicon oxide film and the breakdown voltage of the silicon oxide film thus formed. Further, FIG. 7 shows the relationship between the pressure and the surface state density of the silicon oxide film. In FIG. 7, it should be noted that the oxygen partial pressure is set to 3%.

Referring to FIG. 7, it can be seen that the breakdown voltage of the silicon oxide film becomes maximum and the surface state density becomes minimum when the pressure of about 1 Torr is used at the time of forming the oxide film. From the result of FIG. 7, it is concluded that the preferable pressure of forming an oxide film by using a Kr/$O_2$ mixed gas would be 800–1200 mTorr. The result of FIG. 7 is valid not only for the process on the (100) surface but also for the process on the (111) surface.

Figure 8B:
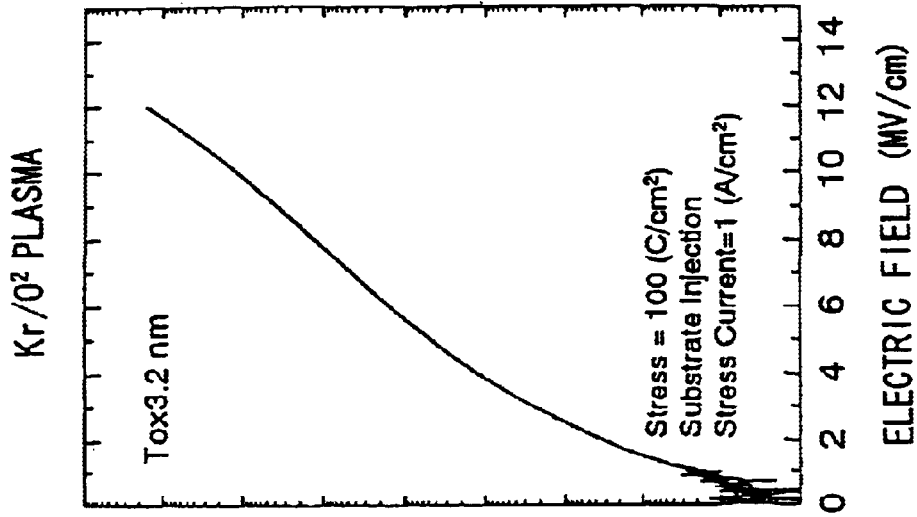
FIGS. 8A and 8B are diagrams showing the relationship between the surface state density and break down voltage of the silicon oxide film obtained according to the first embodiment of the present invention and the total pressure of the processing chamber.
Figure 8A:
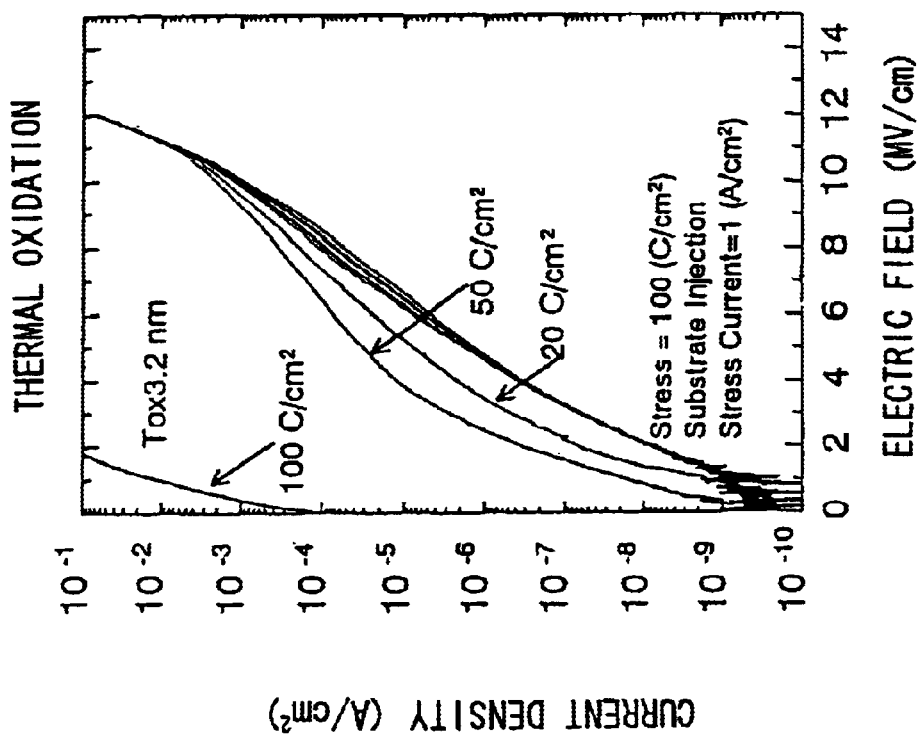

In addition to the foregoing, other various preferable characteristics were obtained for the oxide film formed by the oxidation of silicon substrate surface by the Kr/$O_2$ high density plasma with regard to electronic and reliability characteristics, including the breakdown characteristic, the leakage characteristic, the hotcarrier resistance, and the QBD (Charge-to-Breakdown) characteristic, which represents the amount of electric charges that leads a silicon oxide film to breakdown as a result of application of a stress current, wherein the characteristics thus obtained are comparable to those of the thermal oxide film that is formed at 900° C. FIGS. 8A and 8B show the leakage current induced by a stress current for a silicon oxide film thus obtained, in comparison with the case of a conventional thermal oxide film. In FIGS. 8A and 8B, the thermal oxide film has a thickness of 3.2 nm.

Referring to FIGS. 8A and 8B, it can be seen that there occurs an increase of leakage current with injection of electric charges into the conventional thermal oxide film, while there occurs no such a change of electric current in the plasma oxide film that is formed by using the Kr/$O_2$ plasma, even in the case electric charges of 100 C/cm² are injected. Thus, the silicon oxide film of the present invention has a very long lifetime and it takes a very long time for a tunneling current to cause degradation in the oxide film. The oxide film of the present invention is thus most suitable for the tunneling oxide film of a flash memory device.

As noted previously, the oxide film grown by the Kr/$O_2$ high density plasma has a characteristic comparable with, or superior to, the conventional high-temperature thermal oxide film formed on the (100) surface, for both of cases in which the oxide film is grown on the (100) surface and the oxide film is grown on the (111) surface, in spite of the fact that the oxide film is formed at a low temperature of 400° C. It is noted that the existence of Kr in the oxide film contributes also to this effect. More specifically, the existence of Kr in the oxide film causes relaxation of stress at the Si/$SiO_2$ interface and decrease of the electric charges in the film and the surface state density, leading to remarkable improvement of electric properties of the oxide film. Particularly, the existence of Kr atoms with a density of $10^{20}$ cm$^{-2}$ as represented in FIG. 5 is believed to contribute to the improvement of electric properties and reliability properties of the silicon oxide film.

[Second Embodiment]

Next, the process of forming a nitride film at a low temperature by using high density microwave plasma will be described.

In the formation of the nitride film, the same apparatus as the one explained with reference to FIG. 2 is used, except that Ar or Kr is used for the plasma excitation gas at the time of forming the nitride film.

Thus, the vacuum vessel (processing chamber) 101 is evacuated to a high vacuum state first, and the pressure inside the processing chamber 101 is then set to about 100 mTorr (about 13 Pa) by introducing an Ar gas and a $NH_2$ gas via the shower plate 102, and the like. Further, a disk shaped substrate such as a silicon wafer is placed on the stage 104 as the substrate 103 and the substrate temperature is set to about 500° C. As long as the substrate temperature is in the range of 400–500° C., almost the same results are obtained.

Next, a microwave of 2.45 GHz is introduced into the processing chamber from the coaxial wave guide 105 via the radial line slot antenna 106 and further through the dielectric plate 107, and there is induced high density plasma in the processing chamber. It should be noted that a similar result is obtained as long as a microwave in the frequency of 900 MHz or more but not exceeding 10 GHz is used. In the illustrated example, the distance between the shower plate 102 and the substrate 103 is set to 6 cm. Narrower the distance, faster the film formation rate. While the present embodiment shows the example of forming a film by using the plasma apparatus that uses the radial line slot antenna, it is possible to use other method for introducing the microwave into the processing chamber.

In the present embodiment, it should be noted that an Ar gas is used for exciting plasma. However, a similar result is obtained also when a Kr gas is used. While the present embodiment uses $NH_3$ for the plasma process gas, it is also possible to use a mixed gas of $N_2$ and $H_2$ for this purpose.

In the high density plasma excited in the mixed gas of Ar or Kr and $NH_3$(or alternatively $N_2$ and $H_2$), there are formed NH* radicals efficiently by Ar* or Kr* having an intermediate excitation state, and the NH* radicals thus formed cause the desired nitridation of the substrate surface. Conventionally, there has been no report of direct nitridation of silicon surface. Thus, a nitride film has been formed by a plasma CVD process, and the like. However, the nitride film thus formed by a conventional plasma CVD process does not have the quality required for a gate insulation film of a transistor. In the nitridation of silicon according to the present embodiment, on the other hand, it is possible to form a high-quality nitride film at low temperature on any of the (100) surface and the (111) surface, irrespective of the surface orientation of the silicon substrate.

Meanwhile, it should be noted that existence of hydrogen is an important factor when forming a silicon nitride film. With the existence of hydrogen in plasma, the dangling bonds existing in the silicon nitride film or at the nitride film interface are terminated in the form of Si—H bond or N—H bond, and the problem of electron trapping within the silicon nitride film or on the silicon nitride interface is eliminated. The existence of the Si—H bond and the N—H bond in the nitride film is confirmed in the present invention by infrared absorption spectroscopy or X-ray photoelectron spectroscopy. As a result of the existence of hydrogen, the hysteresis of the CV characteristic is also eliminated. Further, it is possible to suppress the surface state density of the silicon/silicon nitride interface below $3 \times 10^{10}$ cm$^{-2}$ by setting the substrate temperature to 500° C. or more. In the event the silicon nitride film is formed by using an inert gas (Ar or Kr) and a mixed gas of $N_2/H_2$, the number of the traps of electrons or holes in the film decreases sharply by setting the partial pressure of the hydrogen gas to 0.5% or more.

Further, it should be noted that modification process of a nitride film of the present invention can be conducted at a low temperature of 550° C. or less. Thus, there is caused no decoupling of hydrogen atoms terminating the dangling bonds in the nitride film.

Figure 9:
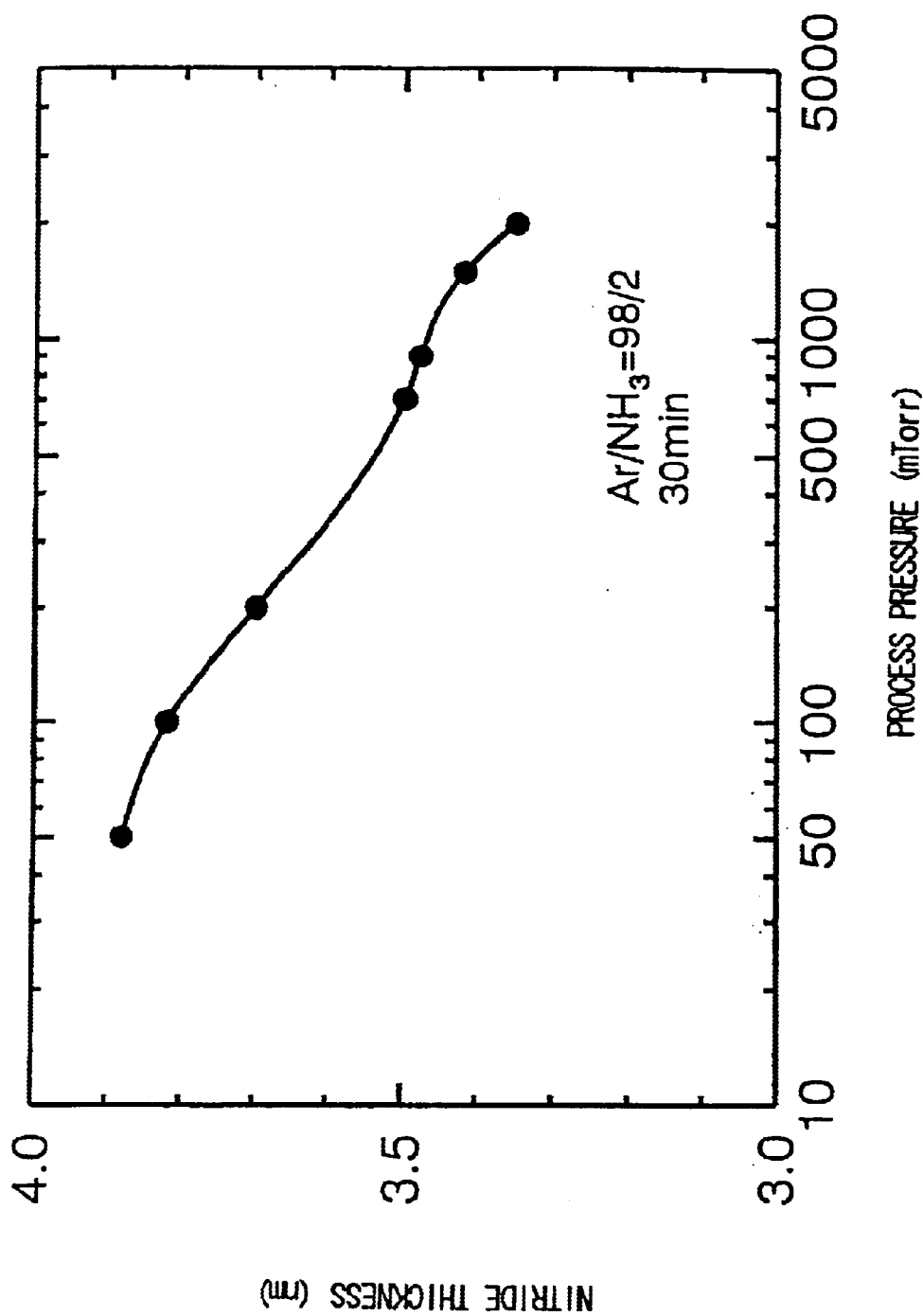
FIG. 9 is a diagram showing the dependence of film thickness on the total pressure used in the processing chamber for a nitride film formed according to a second embodiment of the present invention.

FIG. 9 shows the pressure dependence of the film thickness of the silicon nitride film thus formed according to the foregoing process. In the illustrated example, the ratio of the Ar gas to the $NH_3$ gas is set to 98:2 in terms of partial pressure, and the film formation was conducted over the duration of 30 minutes.

Referring to FIG. 9, it can be seen that the growth rate of the nitride film increases when the pressure in the processing chamber 101 is reduced so as to increase the energy given to $NH_3$ (or $N_2/H_2$) from the inert gas (Ar or Kr). From the viewpoint of efficiency of nitridation, it is therefore preferable to use the gas pressure of 50–100 mTorr (about 7–13 Pa). Further, it is preferable to set the partial pressure of $NH_3$ (or $N_2/H_2$) in the rare gas atmosphere to 1–10%, more preferably to 2–6%.

It should be noted that the silicon nitride film of the present embodiment has a dielectric constant of 7.9, which is almost twice as large as that of a silicon oxide film.

FIG. 10 shows the current-voltage characteristic of the silicon nitride film of the present embodiment. It should be noted that the result of FIG. 10 is obtained for the case in which a silicon nitride film having a thickness of 4.2 nm (2.1 nm in terms of oxide film equivalent thickness) is formed by using a gas mixture of $Ar/N_2/H_2$ while setting the gas composition ratio, $Ar:N_2:H_2$, to 93:5:2 in terms of partial pressure. In FIG. 10, the result for the foregoing nitride film is compared also with the case of a thermal oxide film having a thickness of 2.1 nm.

Referring to FIG. 10, it can be seen that there is realized a very small leakage current, smaller than the leakage current of a silicon oxide film by a factor of 104 or more, is obtained when a voltage of 1V is applied for the measurement. This result indicates that the silicon nitride film thus obtained can be used as the insulating film that is provided between a floating gate electrode and a control gate electrode of a flash memory device for suppressing the leakage current flowing therebetween.

It should be noted that the foregoing condition of film formation, the property of the film, or the electric characteristic of the film are obtained similarly on any of the surfaces of the silicon crystal. In other words, the same result is obtained on the (100) surface and also on the (111) surface. According to the present invention, therefore, it is possible to form a silicon nitride film of excellent quality on any of the crystal surfaces of silicon. It should be noted that the existence of the Si—H bond or N—H bond in the film is not the only cause of the foregoing advantageous effect of the present invention. The existence of Ar or Kr in the film contributes also to the foregoing advantageous result. As a result of the existence of Ar or Kr in the film, it should be noted that the stress within the nitride film or the stress at the silicon/nitride film interface is relaxed substantially, while this relaxation of stress also contributes to the reduction of fixed electric charges and the surface state density in the silicon nitride film, which leads to the remarkable improvement of electric properties and reliability. Particularly, the existence of Ar or Kr with the density of $10^{10}$ cm$^{-2}$ is thought as contributing effectively to the improvement of electric characteristics and reliability of the silicon nitride film, just in the case of the silicon oxide film represented in FIG. 5.

[Third Embodiment]

The foregoing method of forming oxide film or nitride film is applicable also to the oxidation or nitridation of polysilicon. Thus, the present invention enables formation of a high-quality oxide film or nitride film on polysilicon.

Hereinafter, the method of forming a dielectric film on a polysilicon film according to a third embodiment of the present invention will be described with reference to FIGS. 11A and 11B.

Referring to FIG. 11A, a polysilicon film 203 is deposited on a silicon substrate 201 covered by an insulation film 202. By exposing the polysilicon film 203 to the high density mixed gas plasma of Kr or Ar and oxygen in the processing vessel 101 of the microwave plasma processing apparatus of FIG. 2 in the step of FIG. 11B, a silicon oxide film 204 having a high film quality is obtained on the surface of the polysilicon film 203, wherein the silicon oxide film 204 thus formed is characterized by small surface state density and small leakage current.

In the step of FIG. 11B, it is also possible to form a high-quality nitride film 205 on the surface of the polysilicon film 203 by exposing the polysilicon film 203 to the high density mixed gas plasma of Kr or Ar and $NH_3$ or $N_2$ and $H_2$.

Further, it is possible, in the step of FIG. 11B, to form a high-quality oxynitride film 206 on the surface of the polysilicon film 203, by exposing the polysilicon film 203 to the high density mixed gas plasma of Kr or Ar and oxygen and $NH_3$ or $N_2$ and $H_2$.

It should be noted that a polysilicon film formed on an insulation film tends to take a stable state in which the (111) surface is oriented in the direction perpendicular to the insulation film. The polysilicon film having this state is dense and provides good quality. On the other hand, crystal grains of other crystal orientation may exist also in the polysilicon film. According to the method of forming an oxide film or a nitride film or an oxynitride film of the present embodiment, it becomes possible to form a high-quality oxide film, or a high-quality nitride film or a high-quality oxynitride film, irrespective of the surface orientation of silicon layer. Further, the method of forming an oxide film or nitride film of the present embodiment enables a film formation with generally the same growth rate, irrespective of whether the polysilicon film formed on an insulation film is doped with an impurity element of P-type or an impurity element of N-type. Thus, the process of FIGS. 11A and 11B is most suitable for forming a high quality thin oxide film or a nitride film or an oxynitride film on a polysilicon film. It should be noted that the polysilicon film may be the first polysilicon gate electrode that constitutes the floating electrode of flash memory. As the oxide film or nitride film or oxynitride film of the present invention can be formed at a low temperature of 550° C. or less, there arises no problem of rough surface formation on the polysilicon surface.

Further, the modification process of oxynitride film of the present embodiment can be conducted at a low temperature of 550° C. or less. Thus, there occurs no decoupling of the hydrogen atoms terminating the dangling bonds in the oxynitride film.

[Fourth Embodiment]

Figure 12A:
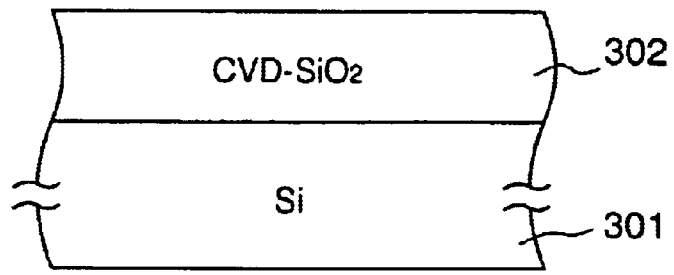
FIGS. 12A and 12B are diagrams showing the modification process of a CVD oxide film according to a fourth embodiment of the present invention.
Figure 12B:
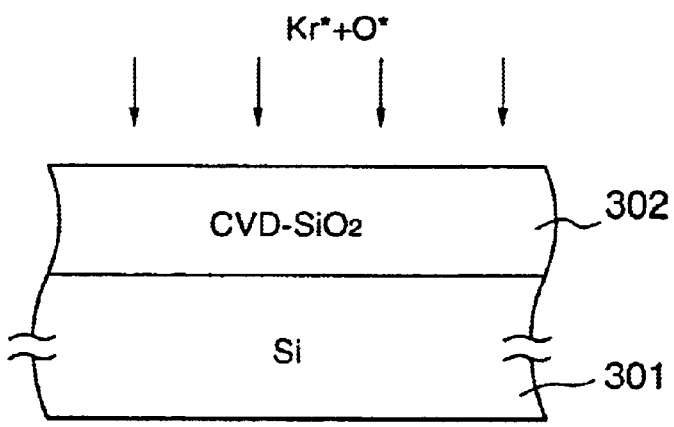

FIGS. 12A and 12B show a modification (post-anneal) process of a CVD-oxide film according to a fourth embodiment of the present invention.

Referring to FIG. 12A, an $SiO_2$ film 302 is deposited on a Si substrate 301 by a CVD process, wherein the $SiO_2$ film 302 thus deposited is exposed to plasma of a mixed gas of Kr or Ar and oxygen in the step of FIG. 12B. Thereby, the atomic state oxygen O*, formed as a result of the reaction taking place in the plasma between K* or Ar* in the intermediate excitation state and $O_2$, penetrate into the $SiO_2$ film 302 and causes a modification of the $SiO_2$ film 302.

In more detail, the foregoing atomic state oxygen O* terminate the dangling bonds in the CVD-$SiO_2$ film 302, and the CVD-$SiO_2$ film 302 thus processed by the post-annealing process of FIG. 12B has a density and structure similar to a thermal oxide film. Particularly, the CVD-$SiO_2$ film 302 has an ideal stoichiometric composition after the post annealing process of FIG. 12B.

Figure 13:
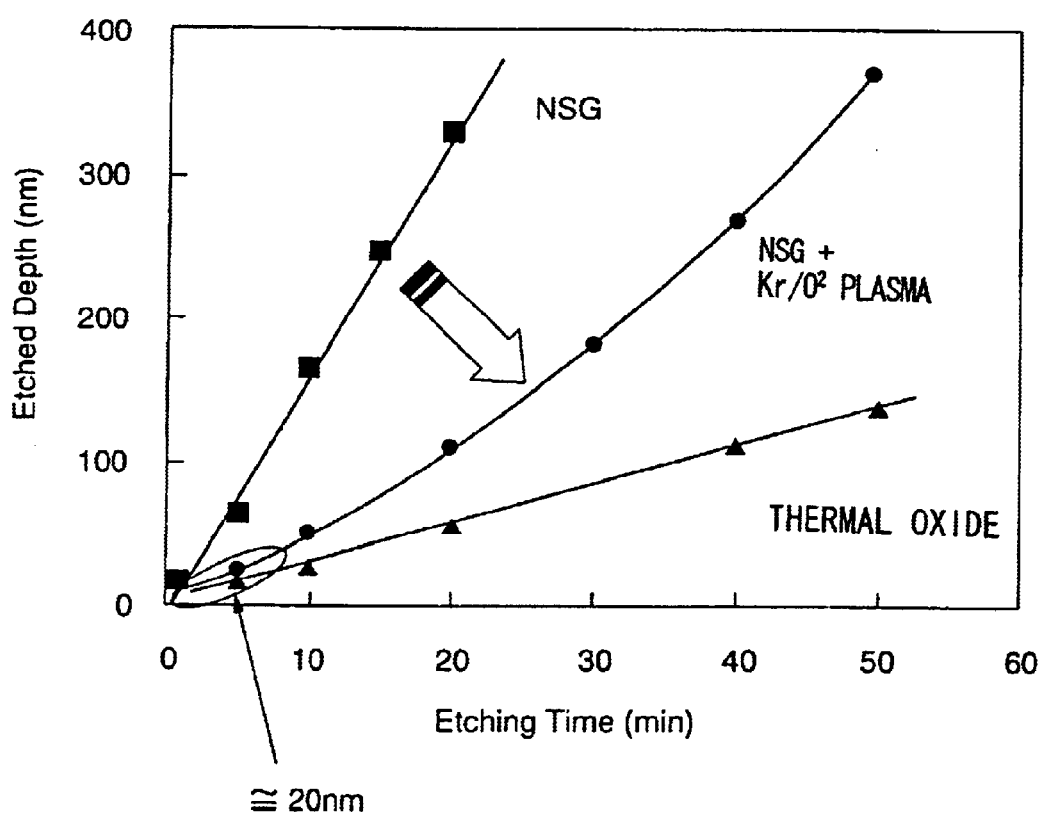
FIG. 13 is a diagram showing the effect of the modification process of the CVD oxide film.

FIG. 13 shows the relationship between the etching rate and the etching depth of a CVD-$SiO_2$ film (NSG) film in the case a surface modification process is applied by conducting the $Kr/O_2$ plasma processing similar to the one used in the first embodiment.

Referring to FIG. 13, it can be seen that a very large etching rate is obtained for an as-deposited CVD-$SiO_2$ film when compared with a thermal oxide film, while it can also be seen that the etching rate is reduced in the case the $Kr/O_2$ plasma process is applied, up to the depth of about 20 nm in correspondence to the initial 10 minutes of the etching process, and a small etching rate comparable with the etching rate of a thermal oxide film is obtained. The foregoing result indicates that the atomic state oxygen O* thus formed by the Kr/O2 process penetrate into the CVD-SiO2 film and induce a densification therein. Such a dense SiO2 film is characterized by the advantageous features of reduced surface states and reduced leakage current.

In the present embodiment, the plasma modification process of the CVD-$SiO_2$ film is most preferably conducted by way of the $Kr/O_2$ plasma processing in which the efficiency of formation of the atomic state oxygen O* is maximum. On the other hand, it is also possible to conduct the plasma modification process by way of the $Ar/O_2$ plasma processing.

[Fifth Embodiment]

Figure 14A:
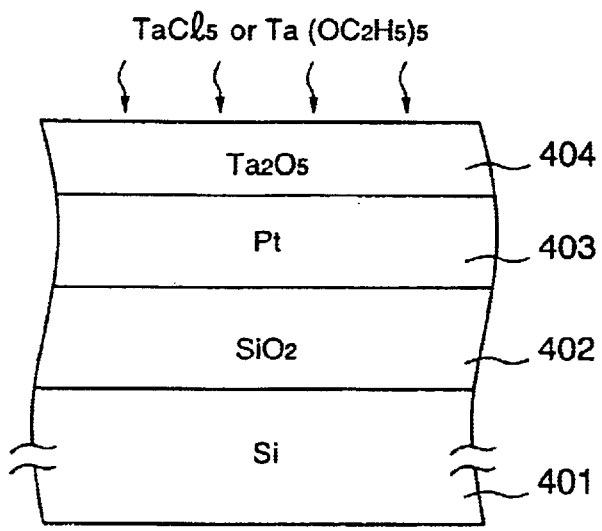
FIGS. 14A and 14B are diagrams showing the modification process of a high dielectric film according to a fifth embodiment of the present invention.
Figure 14B:
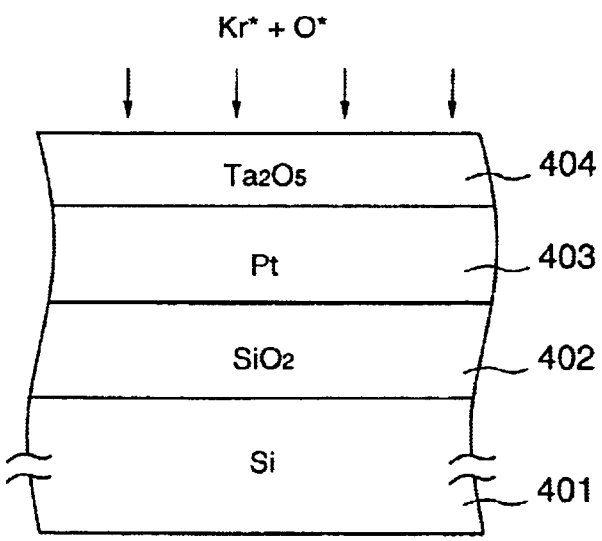

FIGS. 14A and 14B show the post-anneal processing of a high dielectric film according to a fifth embodiment of the present invention.

Referring to FIG. 14A, an $SiO_2$ interlayer insulation film 402 is formed on the surface of an Si substrate 401 by way of a direct oxidation process that uses the $Kr/O_2$ plasma, and the like, wherein the $SiO_2$ interlayer insulation film 402 carries thereon a Pt electrode layer 403 via an intervening adherence layer of Ti, and the like, not illustrated. On the Pt electrode layer 403, a high dielectric film 404 of $Ta_2O_5$ is deposited by a CVD process that uses $TaCl_5$ or $Ta(OC_2H_5)_5$ as the source material. In view of the fact that the $Ta_2O_5$ film 404 contains a large amount of oxygen defects in the as-deposited state, the $Ta_2O_5$ film 404 thus formed in the step of FIG. 14A is characterized by a large leakage current. Further, the $Ta_2O_5$ film does not show the large specific dielectric constant that is pertinent to the material.

The structure of FIG. 14A thus formed is then exposed to the $Kr/O_2$ plasma in the high density plasma processing apparatus of FIG. 2 in the step of FIG. 14B under the condition similar to that of the first embodiment.

In the step of FIG. 14B, there are formed atomic state oxygen efficiently in the plasma as a result of the plasma processing, and the atomic state oxygen compensate for the oxygen defects by penetrating into the $Ta_2O_5$ film 404 efficiently. It should be noted that the $Ta_2O_5$ film 404 has a thickness of several ten nanometers at best, and the atomic state oxygen are introduced for the entire thickness of the ferroelectric film 404.

In the present embodiment, it becomes possible to conduct the oxygen compensating process at a low temperature of 550° C. or less, by using the plasma process of FIG. 14B, and the need of conducting a high temperature rapid thermal annealing (RTA) process in an oxygen atmosphere is no longer necessary. Associated with this, the problem of modification of impurity distribution profile in the active devices that are formed in the Si substrate 401 is also eliminated.

The $Ta_2O_5$ film thus subjected to plasma processing shows a large specific dielectric constant pertinent to a high dielectric material. It should be noted that the high dielectric film 404 is not limited to the $Ta_2O_5$ film but may be a $ZrO_2$ film or a $HfO_2$ film.

After the step of FIG. 14B, an electrode layer of Pt or a conductive oxide such as $SrRuO_3$ is formed on the $Ta_2O_5$ film 404, and there is formed a high dielectric capacitor.

In the present embodiment, it is also possible to form the atomic state oxygen O* efficiently by using an $Ar/O_2$ plasma in place of the $Kr/O_2$ plasma.

[Sixth Embodiment]

Figure 15A:
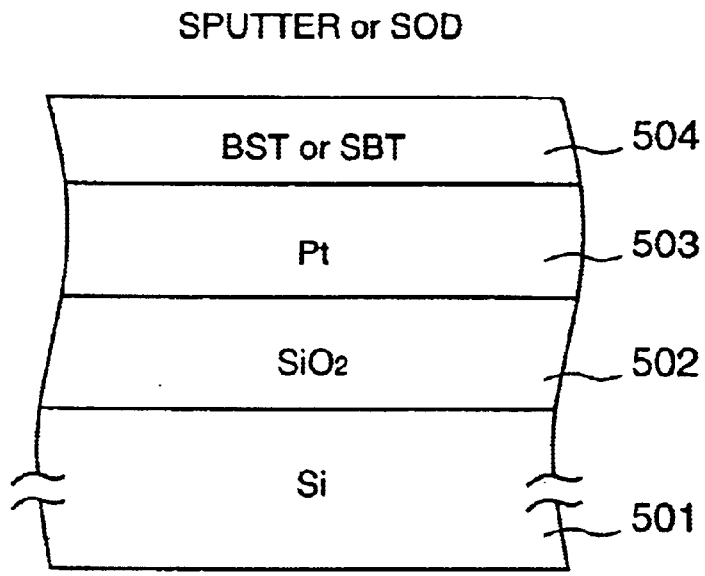
FIGS. 15A and 15B are diagrams showing the modification process of a ferroelectric film according to a sixth embodiment of the present invention.
Figure 15B:
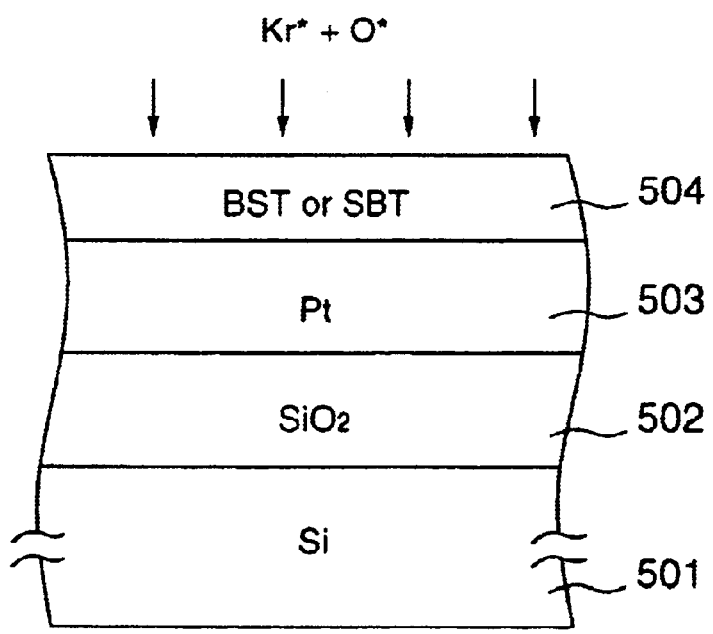

FIGS. 15A and 15B show the post-annealing process of a ferroelectric film according to a sixth embodiment of the present invention.

Referring to FIG. 15A, an $SiO_2$ interlayer insulation film 502 is formed on the surface of an Si substrate 501 by way of a direct oxidation process that uses the $Kr/O_2$ plasma, and the like, wherein the $SiO_2$ interlayer insulation film 502 carries thereon a Pt electrode layer 503 via an intervening adherence layer of Ti, and the like, not illustrated. On the Pt electrode layer 503, a ferroelectric film 504 of BST ($BaSrTiO_3$) or SBT ($SrBi_2(Ta)_2O_9$) is deposited by a sol-gel process or sputtering process. In view of the fact that the ferroelectric film 504 is amorphous in the as-deposited state, the ferroelectric film 504 thus formed in the step of FIG. 15A does not show a large switching electric charge $Q_{sw}$ pertinent to a ferroelectric film.

The structure of FIG. 15A thus formed is then exposed to the $Kr/O_2$ plasma in the high density plasma processing apparatus of FIG. 2 in the step of FIG. 15B under the condition similar to that of the first embodiment.

In the step of FIG. 15B, there are formed atomic state oxygen efficiently in the plasma as a result of the plasma processing, and the atomic state oxygen thus formed cause a crystallization and simultaneously compensation of oxygen defects in the ferroelectric film 504, by penetrating into the ferroelectric film 504 efficiently. It should be noted that the ferroelectric film 504 has a thickness of several ten nanometers at best, and the atomic state oxygen are introduced for the entire thickness of the ferroelectric film 504.

In the present embodiment, it becomes possible to conduct the oxygen compensating process at a low temperature of 550° C. or less by using the plasma process of FIG. 15B, and the need of conducting a high temperature rapid thermal annealing (RTA) process in an oxygen atmosphere is no longer necessary. Associated with this, the problem of modification of impurity distribution profile in the active devices that are formed in the Si substrate 501 is also eliminated.

The ferroelectric film 504 thus subjected to plasma processing shows a large switching electric charge $Q_{sw}$ characteristic to a ferroelectric material. It should be noted that the high dielectric film 504 is not limited to a BST or SBT film but may be a PZT film or a PLZT film.

After the step of FIG. 15B, an electrode layer of Pt or a conductive oxide such as $SrRuO_3$ is formed on the ferroelectric film 504, and there is formed a high dielectric capacitor.

[Seventh Embodiment]

Figure 16A:
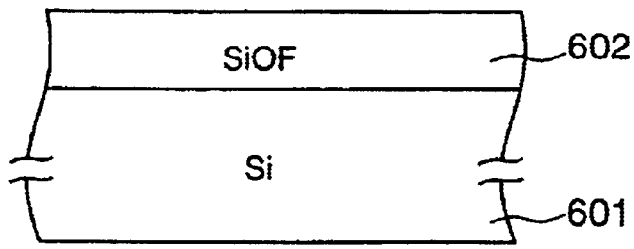
FIGS. 16A and 16B are diagrams showing the modification of a low-dielectric insulation film according to a seventh embodiment of the present invention.
Figure 16B:
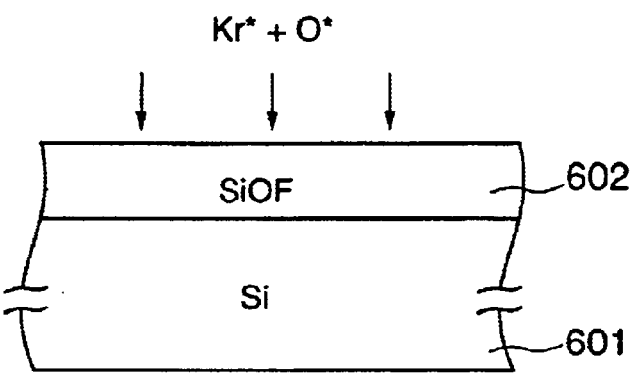

FIGS. 16A and 16B show the post-annealing process of a low-dielectric insulation film according to a seventh embodiment of the present invention.

Referring to FIG. 16A, the Si substrate 601 is covered by a F-doped $SiO_2$ (SiOF) film 602 formed by a CVD process, wherein the F-doped $SiO_2$ film 602 serves for a low-dielectric film. Next, in the step of FIG. 16B, a $Kr/O_2$ plasma processing is applied to the SiOF film 602 in the microwave plasma processing apparatus of FIG. 2 under a condition similar to that of the first embodiment, and the surface and interior of the SiOF film 602 is subjected to modification.

As a result of such a surface modification, adherence is improved when a conductor pattern is formed on the SiOF film 602. Further, leakage current between the interconnection patterns is reduced and improvement is achieved with regard to breakdown voltage.

[Eighth Embodiment]

FIGS. 17A–17E show the process of forming a high dielectric gate insulation film according to an eighth embodiment of the present invention.

Figure 17A:
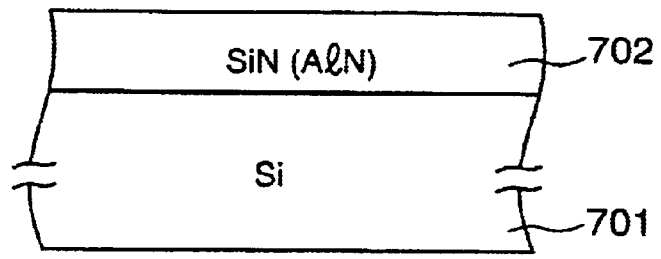
FIGS. 17A–17E are diagrams showing the modification process of a nitride film according to an eighth embodiment of the present invention.
Figure 17B:
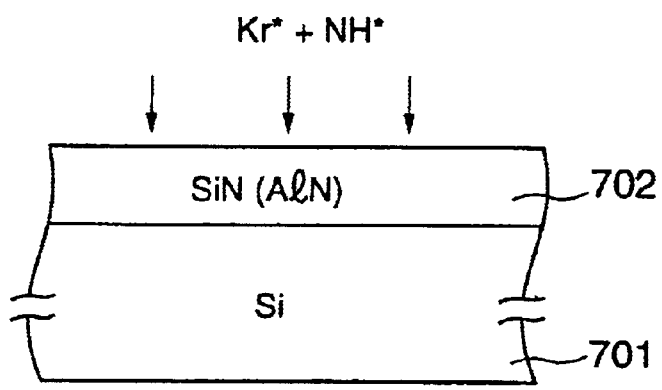

Referring to FIG. 17A, an SiN film 702 is formed on a Si substrate 701 by a CVD process, and the like, with a thickness of 1 nanometer or less, and a step of FIG. 17B is conducted in which the SiN film 702 is exposed to a $Kr/NH_3$ plasma in the microwave plasma processing apparatus of FIG. 2 under a condition similar to that of the second embodiment.

In the step of FIG. 17B, it should be noted that hydrogen nitride radicals NH* associated with the Kr/NH3 plasma penetrate into the SiN film 702 and cause termination of defects such as dangling bonds therein. As a result, the interface state density is reduced in the SiN film 702, and the SiN film 702 is converted to an SiN film having a near stoichiometric composition of $Si_3N_4$ and has excellent leakage characteristic.

Figure 17C:
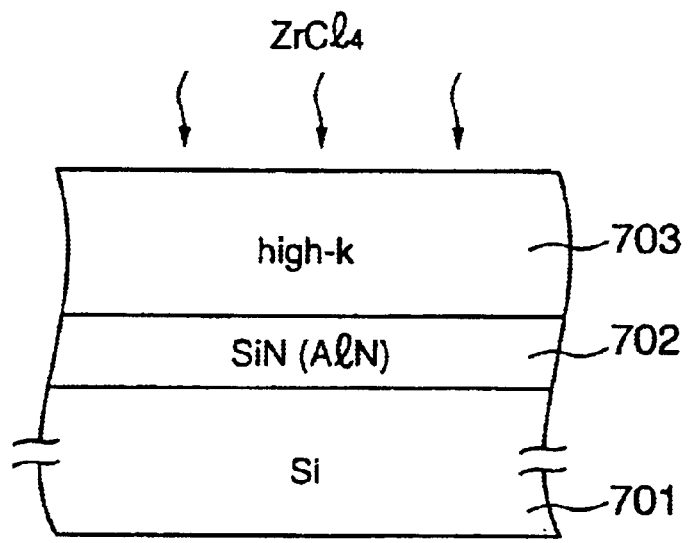

Next, in the step of FIG. 17C, the silicon nitride film 702 thus applied with the post-anneal processing by the $Kr/NH_3$ plasma is covered with a high dielectric film 703 of $ZrO_2$, wherein the ZryO2 film 703 is deposited with a thickness of several nanometers by a CVD process or ALD (atomic layer deposition) process that uses $ZrCl_4$ and $H_2O$ as source materials.

Next, the structure of FIG. 17C is introduced into the microwave plasma processing apparatus of FIG. 2, and the surface of the high dielectric film 703 is exposed to the $Kr/NH_3$ plasma. As a result of such a post-annealing process, the surface of the high dielectric film 703 is subjected to nitridation and a nitride film 703A is formed on the surface of the high dielectric film 703.

Figure 17D:
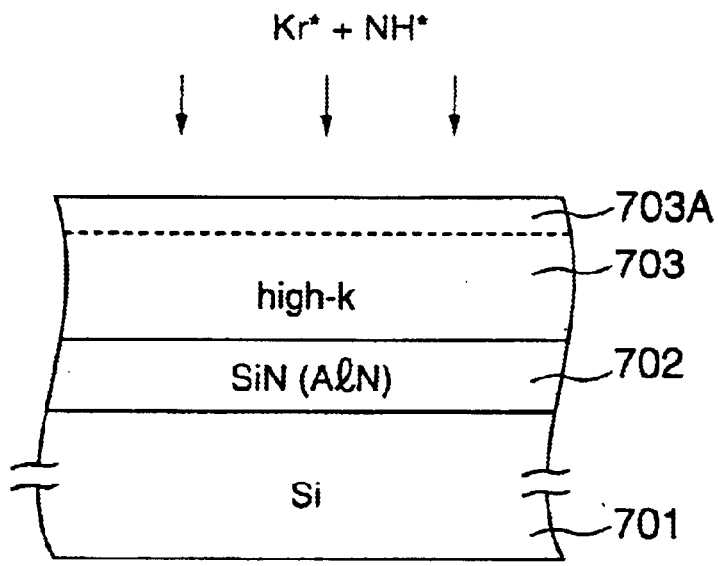
Figure 17E:
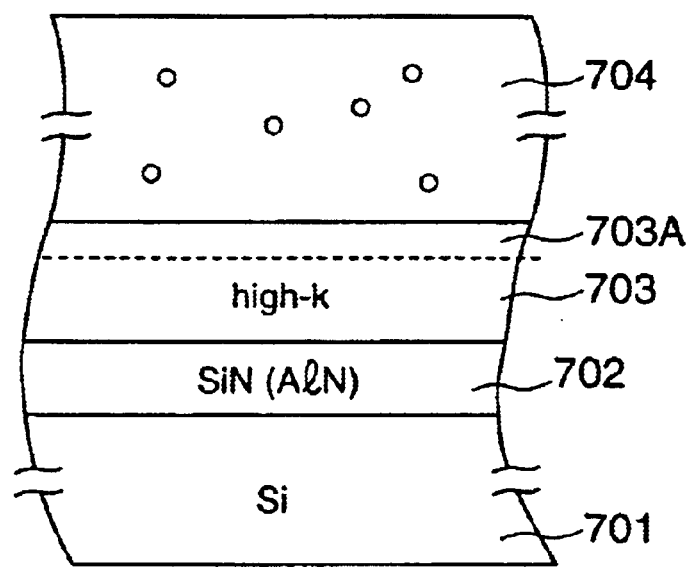

Next, in the step of FIG. 17E, a polysilicon gate electrode 704 is formed on the structure of FIG. 17D.

In the present embodiment, it should be noted that the nitride film 701 formed on the Si substrate 701 is not limited to a silicon nitride film but may be an aluminum nitride film. Further, the high dielectric film 703 is not limited to a $ZrO_2$ film but may be a $HfO_2$ film or a $Ta_2O_5$ film.

According to the present invention, the SiN film 702 is formed on the Si substrate 701 in the step of FIG. 17B with reduced defects, such that the SiN film 702 is dense and has the specific dielectric constant of 7.9. Thus, penetration of oxygen from the high dielectric film 703 to the Si substrate 701 is effectively blocked in the case the high dielectric film 703 of a metal oxide film is formed in the step of FIG. 17C, and the problem of increase of overall effective thickness of the gate insulation film is avoided.

Further, the problem of the high dielectric film 703 being reduced in the later process steps that use a reducing atmosphere, is effectively avoided by forming the nitride film on the surface of the high dielectric film 703 in the step of FIG. 17D.

[Ninth Embodiment]

Figure 18:
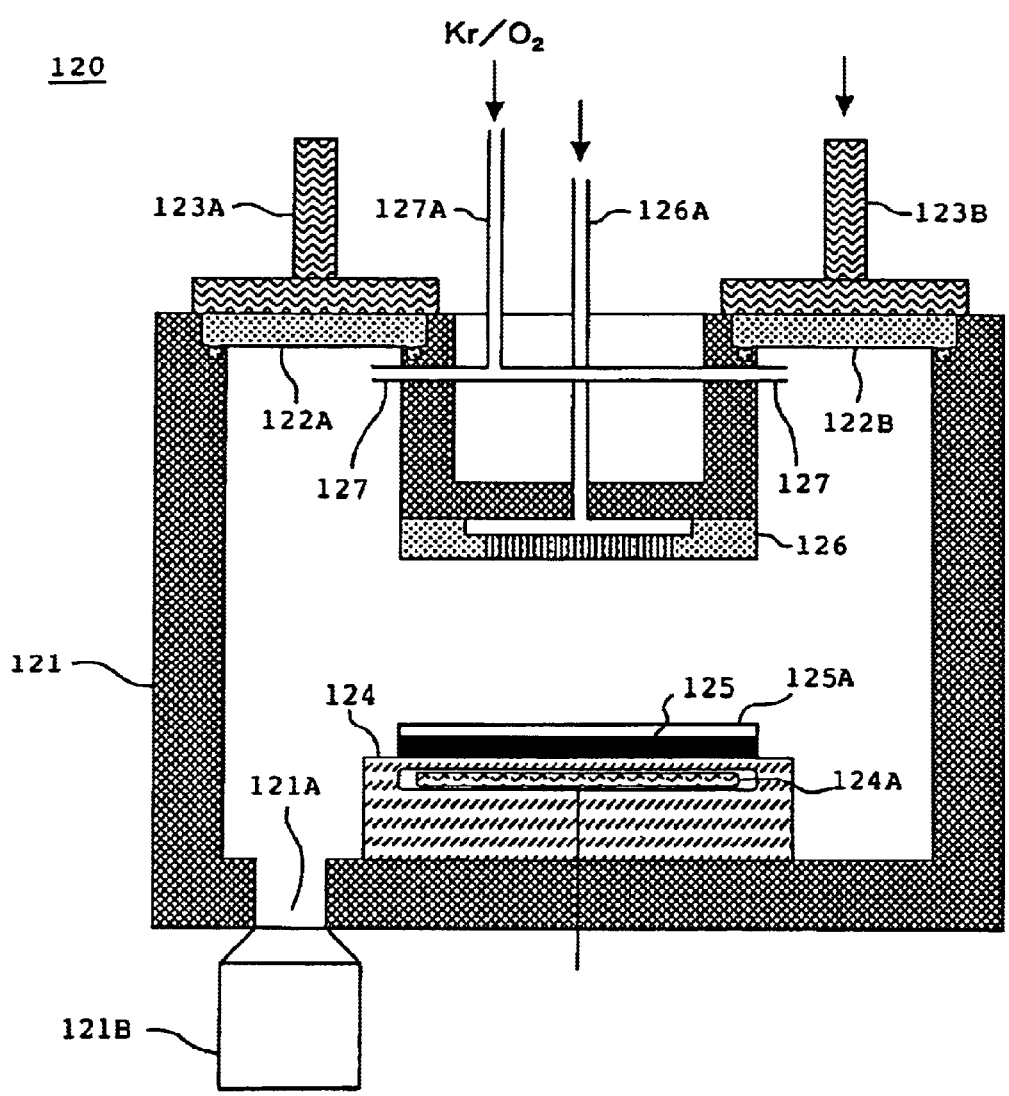
FIG. 18 is a diagram showing the deposition process of an oxide film that is conducted simultaneously to a modification process according to a ninth embodiment of the present invention.

FIG. 18 shows the method of forming an oxide film on a substrate according to a ninth embodiment of the present invention.

Referring to FIG. 18, a CVD apparatus 120 is used, wherein the CVD apparatus 120 has an evacuation port 121A evacuated by a pump 121B and microwave windows 122A and 122B. Further, microwave antennas 123A and 123B are provided on the microwave windows 122A and 122B, respectively.

In the processing chamber 121, there is provided a stage 124 having a heater 124A, and a substrate 125 to be processed is held on the stage 124. Further, a shower plate 126 is provided in the processing chamber 121 so as to face the substrate 125, and process gas supplied from a line 126A is introduced into the processing chamber 120 via the shower plate 126. Further, the processing chamber 121 is formed with a gas inlet port 127 adjacent to the microwave windows 122A and 122B so as to introduce a Kr/O2 plasma gas into the processing chamber 121 from a line 127A. The microwave antennas 123A and 123B may be a radial line slot antenna used in the apparatus of FIG. 2. Further, the microwave antennas 123A and 123B may also be a horn antenna.

In the CVD apparatus 120 of such a construction, there is formed high density plasma of low energy in the processing chamber 121 by supplying a microwave from the antennas 123A and 123B, and associated therewith, there occurs efficient formation of K* and the atomic state oxygen O*.

In the present embodiment, source gases such as $Ta(OC_2H_5)_5$ and $O_2$, and the like are introduced from the shower plate 126, and there is caused deposition of a $Ta_2O_5$ film 125A in the vicinity of the surface of the substrate 125.

It should be noted that the $Ta_2O_5$ film thus deposited is applied with an annealing process by the atomic state oxygen O* as explained previously with reference to the embodiment of FIGS. 12A and 12B, simultaneously to deposition. As a result, the $Ta_2O_5$ film is modified and there is achieved a further improvement with regard to the surface state density and leakage current characteristic. As the deposition and annealing of the $Ta_2O_5$ film is conducted simultaneously, the present embodiment has a further advantageous feature of reduced number of process steps.

In the present embodiment, it should be noted that the CVD film 125A is by no means limited to $Ta_2O_5$, but the present embodiment is applicable also to the case in which the CVD film 125A is an oxide film such as an $SiO_2$ film, a BSG film, or a BPSG film and also to the case in which the CVD film 125A is a nitride film or an oxynitride film.

In the case of depositing a nitride film on the substrate 125 in the present embodiment, a mixed gas of Kr and $NH_3$ or a mixed gas of Kr and $N_2$ and $H_2$ is supplied from the gas inlet port 127. In this case, too, the annealing processing is achieved by the hydrogen nitride radicals NH* simultaneously to the deposition of a silicon nitride film, and thus, the silicon nitride film thus obtained has advantageous characteristics of low surface state density and small leakage current, suitable for use as a gate insulation film of a semiconductor device.

In the case of depositing an oxynitride film on the substrate 125 in the present embodiment, Kr, $O_2$, and $NH_3$ or a mixed gas $N_2$ and $H_2$ are supplied from the gas inlet port 127. In this case, too, the oxynitride film thus obtained has advantageous characteristics of low surface state density and small leakage current, suitable for use as a gate insulation film of a semiconductor device.

[Tenth Embodiment]

Next, sputtering process that uses atomic state oxygen O* excited by a $Kr/O_2$ plasma or hydrogen nitride radicals NH* excited by a $Kr/NH_3$ plasma according to a tenth embodiment of the present invention will be described with reference to FIG. 19, wherein those parts corresponding to the parts described previously are designated by the same reference numerals and the description thereof will be omitted.

Figure 19:
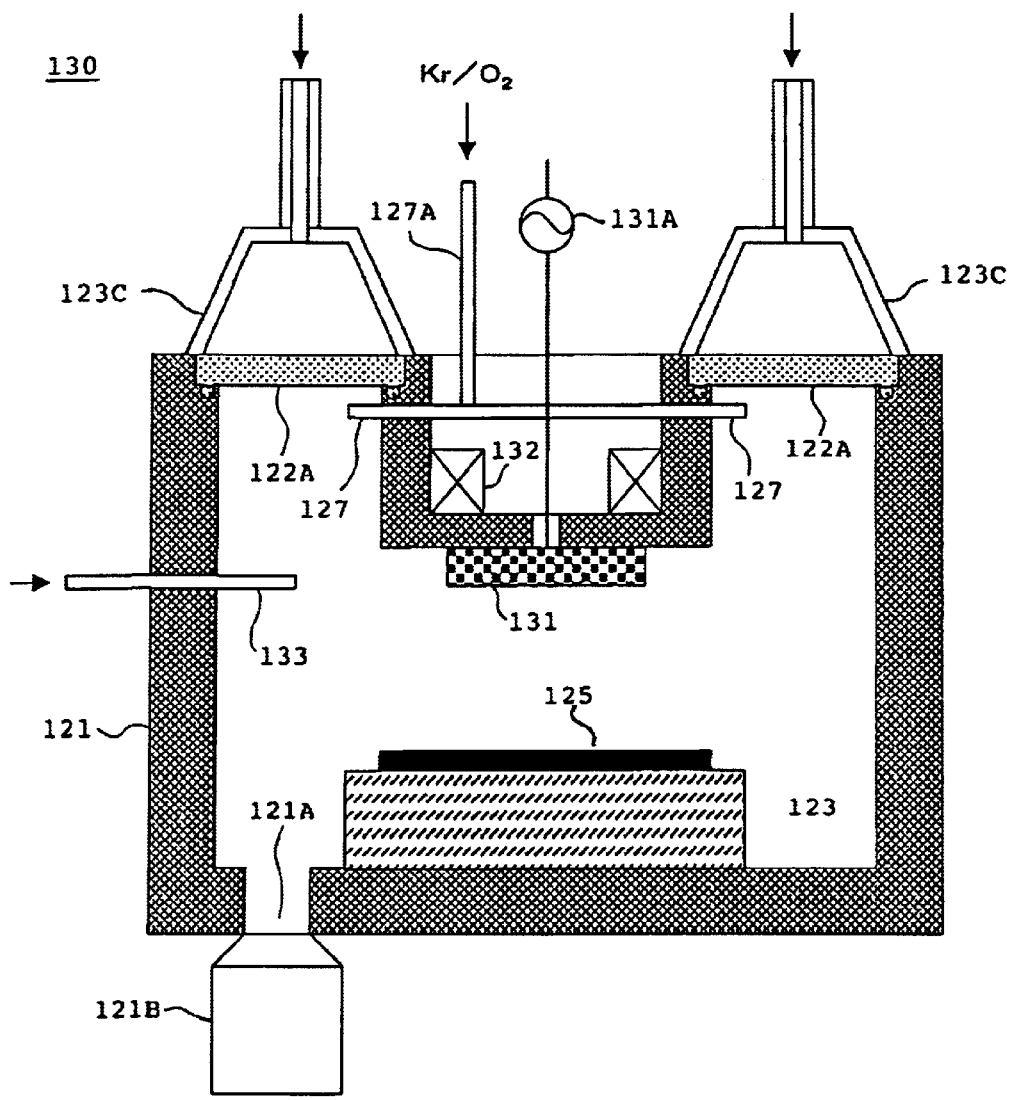
FIG. 19 is a diagram showing the sputtering process of a high dielectric film that is conducted simultaneously to a modification process according to a tenth embodiment of the present invention.

In the present embodiment, a sputtering apparatus 130 shown in FIG. 19 is used in place of the CVD apparatus 120.

Referring to FIG. 19, the sputtering apparatus 130 includes a target 131 of BST, and the like, supplied with a radio frequency power from a radio frequency source 131A is disposed so as to face the substrate 125 held on a stage 123, and a magnet 132 is provided in the vicinity of the target 131. Further, the sputtering apparatus 130 of FIG. 19 is provided with a gas inlet port 133 in place of the shower plate 126.

Further, the construction of FIG. 19 uses ordinary horn antennas 123C in correspondence to the microwave windows 122A as a microwave antenna.

In the sputtering apparatus 130 of such a construction, there is formed an oxide film such as a BST film on the substrate 125 as a result of sputtering of the target 131, wherein a Kr gas or a $Kr/O_2$ gas is introduced into the processing chamber 121 from the gas inlet port 127. Further, a microwave is introduced into the processing chamber 121 from the microwave antennas 123C. As a result, there occurs efficient formation of atomic state oxygen O* in the processing apparatus, and the BST film formed on the substrate 125 is applied with a post-annealing process of the atomic state oxygen O* simultaneously to deposition. Further, it is possible to introduce an atmospheric gas from the gas inlet port 133 separately.

In the sputtering apparatus 130 of FIG. 19, it is also possible to deposit a nitride film on the substrate 125 by using a nitride for the target 131, while introducing a mixed gas of Ar or Kr and $NH_3$ or a mixed gas of Ar or Kr and $N_2$ and $H_2$ from the gas inlet port. Thereby, the nitride film thus deposited is subjected to a post-annealing process by the hydrogen nitride radicals NH* formed in the plasma.

Further, it is possible, in the sputtering apparatus 130 of FIG. 19, to deposit an oxynitride film on the substrate 125 by using an oxynitride for the target 131, while introducing a mixed gas of Ar or Kr and oxygen and $NH_3$ or a mixed gas of Ar or Kr and oxygen and $N_2$ and $H_2$ from the gas inlet port. Thereby, the oxynitride film thus deposited is subjected to a post-annealing process by the atomic state oxygen O* and hydrogen nitride radicals NH* formed in the plasma.

[Eleventh Embodiment]

Next, the fabrication process of a flash memory device according to a fifth embodiment of the present invention will be described, wherein the flash memory device of the present embodiment uses the technology of low-temperature formation of oxide film and nitride film while using the microwave plasma explained above, wherein the present embodiment also includes a high-voltage transistor and a low-voltage transistor having a gate electrode of polysilicon/silicide stacked structure.

Figure 20:
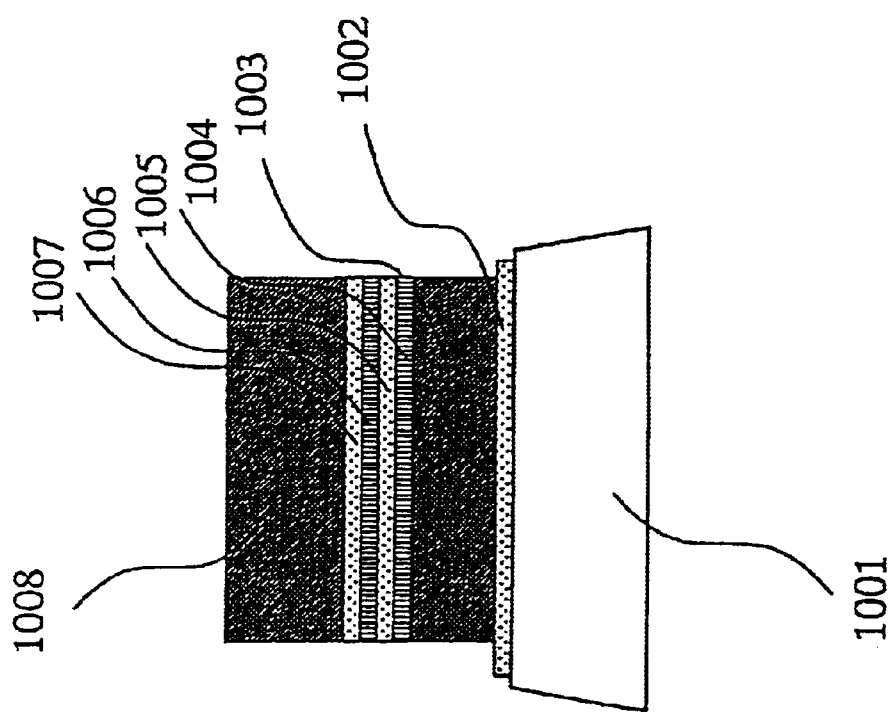
FIG. 20 is a diagram showing the cross-section of a flash memory device according to an eleventh embodiment of the present invention.

FIG. 20 shows the schematic cross-sectional structure of a flash memory device 1000 according to the present embodiment.

Referring to FIG. 20, the flash memory device 1000 is constructed on the silicon substrate 1001 and includes the tunneling oxide film 1002 formed on the silicon substrate 1001 and the first polysilicon gate electrode 1003 formed on the tunneling oxide film 1002 as a floating gate electrode, wherein the polysilicon gate electrode 1003 is further covered consecutively by the silicon nitride film 1004, a silicon oxide film 1005, a silicon nitride film 1006 and a silicon oxide film 1007, and the second polysilicon gate electrode 1008 is formed further on the silicon nitride film 1007 as a control gate electrode. In FIG. 19, illustration of source region, drain region, contact holes, interconnection patterns, and the like, is omitted.

In the flash memory of the present embodiment, the silicon oxide films 1002, 1005 and 1007 are formed according to the process of silicon oxide film formation explained before. Further, the silicon nitride films 1004 and 1006 are formed according to the process of silicon nitride film formation explained before. Thus, excellent electric property is guaranteed even when the thickness of these films is reduced to one-half the thickness of conventional oxide film or nitride film.

Next, the fabrication process of a semiconductor integrated circuit including the flash memory device of the present embodiment will be explained with reference to FIGS. 21–24.

Figure 21:
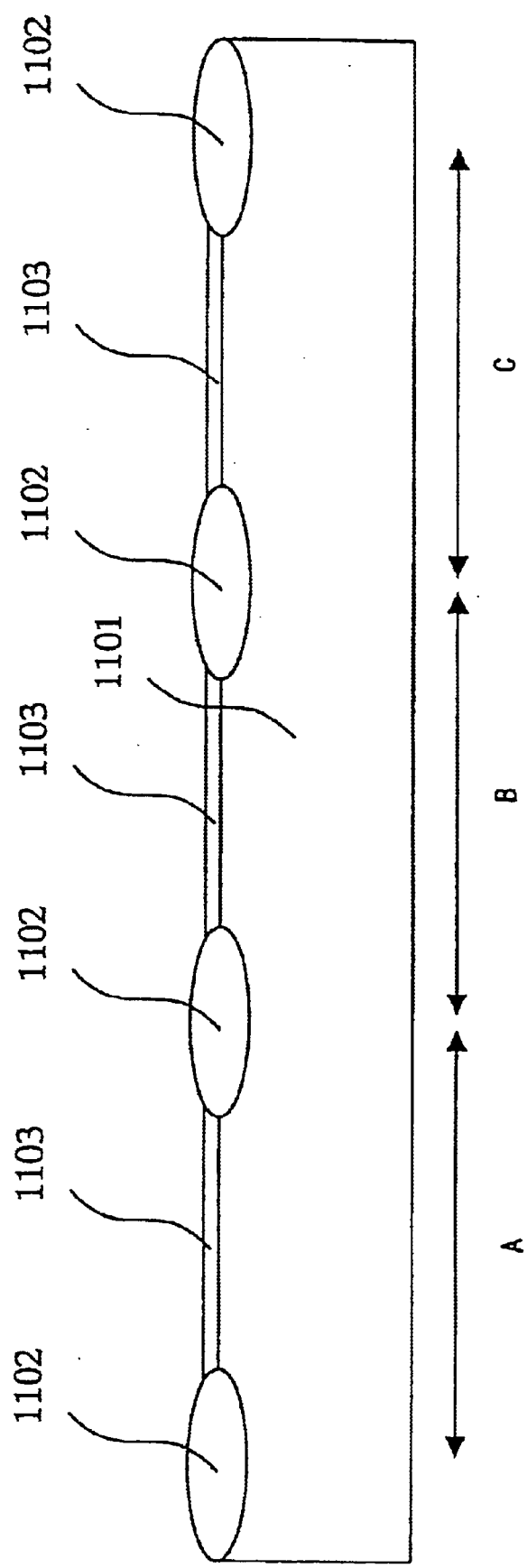
FIGS. 21–24 are diagrams showing the fabrication process of a flash memory device according to a twelfth embodiment of the present invention.

Referring to FIG. 21, a silicon substrate 1101 carries a field oxide film 1102 such that the field oxide film 1102 defines, on the silicon substrate 1101, a flash memory cell region A, a high-voltage transistor region B and a low-voltage transistor region C, wherein each of the regions A–C is formed with a silicon oxide film 1103. The field oxide film 1102 may be formed by a selective oxidation (LOCOS) process or a shallow trench isolation process.

In the present embodiment, a Kr gas is used for the plasma excitation gas at the time of formation of the oxide film and the nitride film. Further, the microwave plasma processing apparatus of FIG. 2 is used for the formation of the oxide film and the nitride film.

Figure 22:
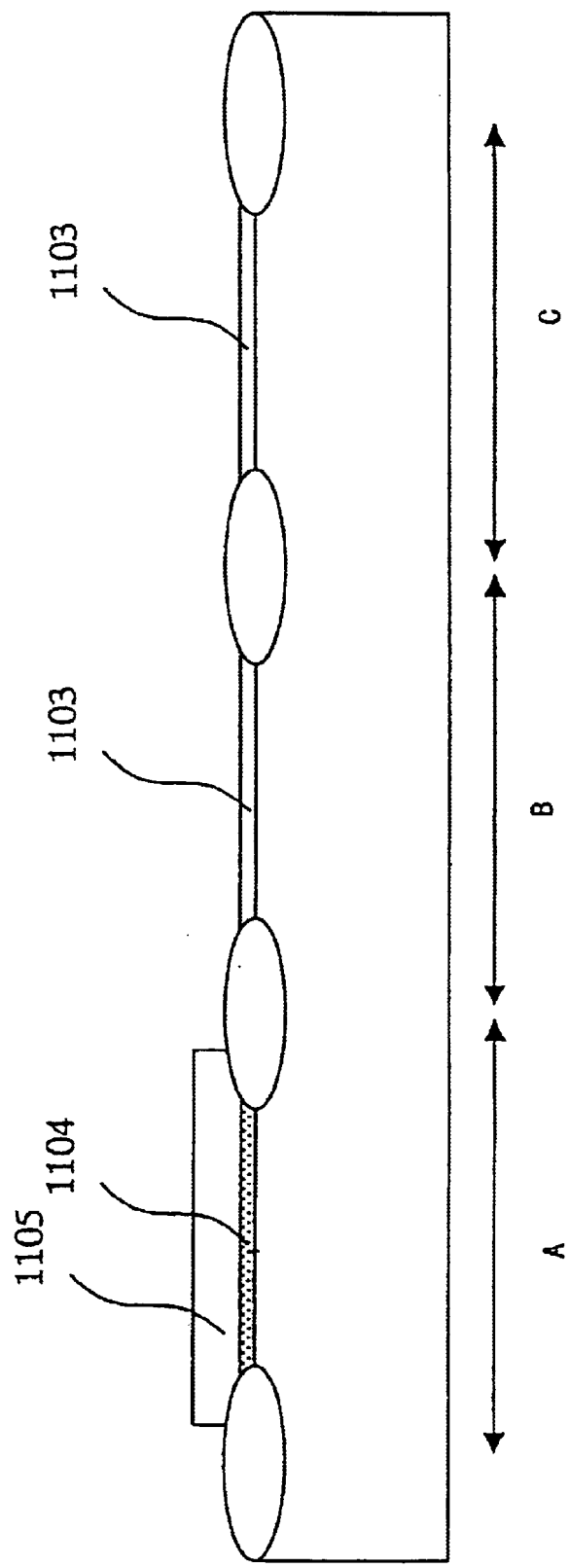

Next, in the step of FIG. 22, the silicon oxide film 1103 is removed in the memory cell region A and a tunneling oxide film 1104 is formed on the memory cell region A with a thickness of about 5 nm. During the formation of the tunneling oxide film 1104, the vacuum vessel (reaction chamber) 101 is evacuated to a vacuum state and the Kr gas and an $O_2$ gas is introduced from the shower plate 102 such that the pressure inside of the reaction chamber reaches 1 Torr (about 133 Pa). Further, the temperature of the silicon wafer is set to 450° C., and a microwave of 2.56 GHz frequency in the coaxial wave guide 105 is supplied to the interior of the processing chamber via the radial line slot antenna 106 and the dielectric plate 107. As a result, there is formed a high density plasma.

In the step of FIG. 22, a first polysilicon film 1105 is deposited, after the step of forming the tunneling oxide film 1104, such that the first polysilicon film 1105 covers the tunneling oxide film 1104, and the surface of the polysilicon film 1105 thus deposited is planarized by conducting a hydrogen radical processing. Further, the first polysilicon film 1105 is removed from the high-voltage transistor region B and the low-voltage transistor region by way of patterning, leaving the first polysilicon film 1105 selectively on the tunneling oxide film 1104 of the memory cell region.

Figure 23:
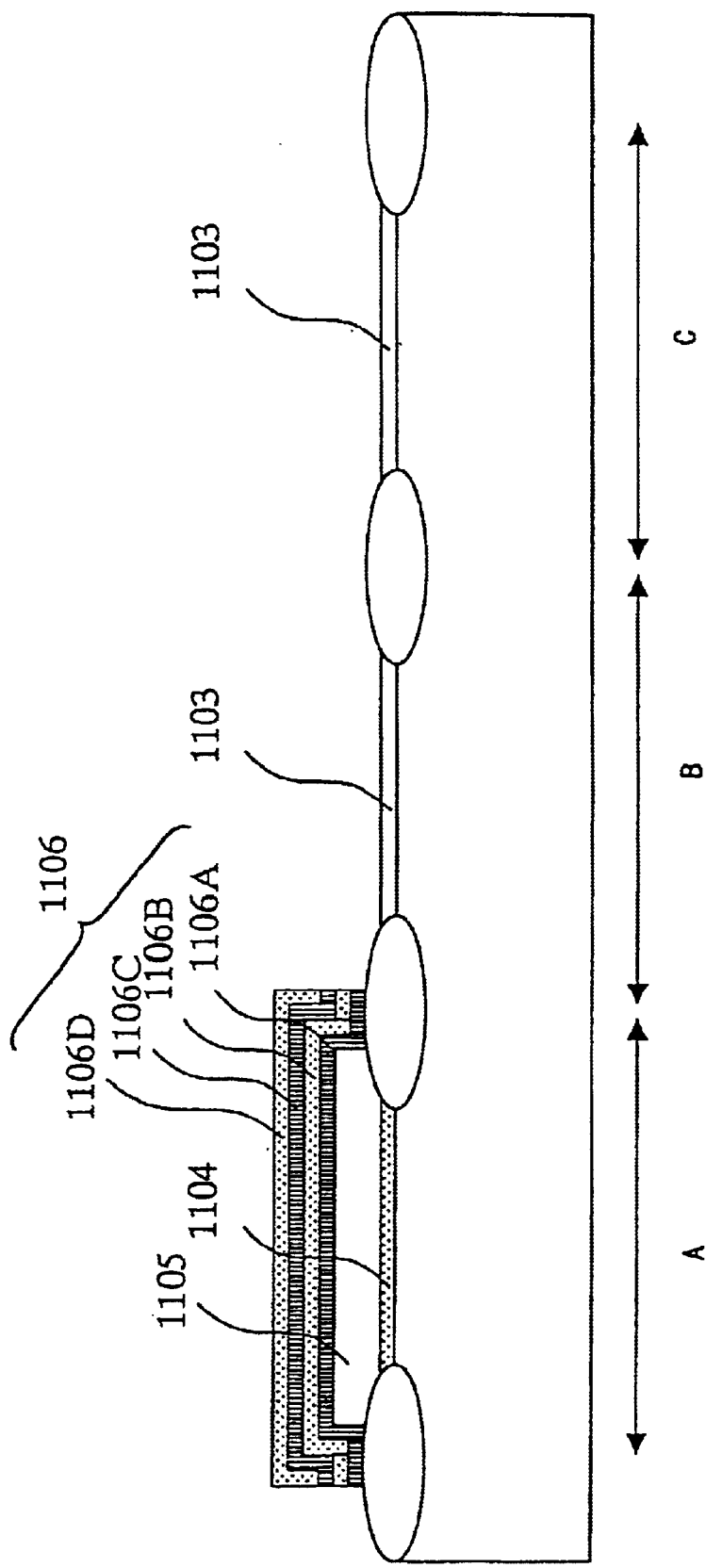

Next, in the step of FIG. 23, a lower nitride film 1106A, a lower oxide film 1106B, an upper nitride film 1106C and an upper oxide film 1106D are formed consecutively on the structure of FIG. 21. As a result, an insulation film 1106 having an NONO structure is formed by using the microwave plasma processing apparatus of FIG. 2.

In more detail, the vacuum vessel (processing chamber) 101 of the microwave plasma processing apparatus of FIG. 2 is evacuated to a high-vacuum state, and the Kr gas, an $N_2$ gas and an $H_2$ gas are introduced into the processing chamber 101 from the shower plate 102 until the pressure inside the processing chamber is set to about 100 mTorr (about 13 Pa). Further, the temperature of the silicon wafer is set to 500° C. In this state, a microwave of 2.45 GHz frequency is introduced into the processing chamber from the coaxial wave guide 105 via the radial line slot antenna 106 and the dielectric plate 107, and there is formed a high density plasma in the processing chamber. As a result of this, a silicon nitride film of about 6 nm thickness is formed on the polysilicon surface as the lower nitride film 1106A.

Next, the supply of the microwave is interrupted. Further, the supply of the Kr gas, the $N_2$ gas and the $H_2$ gas is interrupted, and the vacuum vessel (processing chamber) 101 is evacuated. Thereafter, the Kr gas and the $O_2$ gas are introduced again into the processing chamber via the shower plate 102, and the pressure in the processing chamber is set to 1 Torr (about 133 Pa). In this state, the microwave of 2.45 GHz frequency is supplied again, and there is formed high density plasma in the processing chamber 101. As a result, a silicon oxide film of about 2 nm thickness is formed as the lower oxide film 1106B.

Next, the supply of the microwave is again interrupted. Further, the supply of the Kr gas and the $O_2$ gas is interrupted, and the processing chamber 101 is evacuated. Thereafter, the Kr gas, the $N_2$ gas and the $H_2$ gas are introduced into the processing chamber via the shower plate 102 so that the pressure inside the processing chamber is set to 100 mTorr (about 13 Pa). In this state, a microwave of 2.45 GHz frequency is introduced and high density plasma is formed in the processing chamber 101. As a result of the plasma processing using the high density plasma thus formed, there is further formed a silicon nitride film of 3 nm thickness.

Finally, the supply of the microwave is interrupted. Further, the supply of the Kr gas, the $N_2$ gas and the $H_2$ gas is also interrupted, and the vacuum vessel (processing chamber) 101 is evacuated. Thereafter, the Kr gas and the $O_2$ gas are introduced again via the shower plate 102 and the pressure inside the processing chamber is set to 1 Torr (about 133 Pa). In this state, the microwave of 2.45 GHz frequency is again supplied, and high density plasma is formed in the processing chamber 101. As a result, a silicon oxide film of 2 nm thickness is formed as the upper oxide film 1106D.

Thus, according to the foregoing process steps, it becomes possible to form the insulation film 1106 of the NONO structure with a thickness of 9 nm. It was confirmed that the NONO film 1106 thus formed does not depend on the surface orientation of polysilicon and that each of the oxide films and the nitride films therein is highly uniform in terms of film thickness and film quality.

In the step of FIG. 23, the insulation film 1106 thus formed is further subjected to a patterning process such that the insulation film 1106 is selectively removed in the high-voltage transistor region B and in the low-voltage transistor region C.

Figure 24:
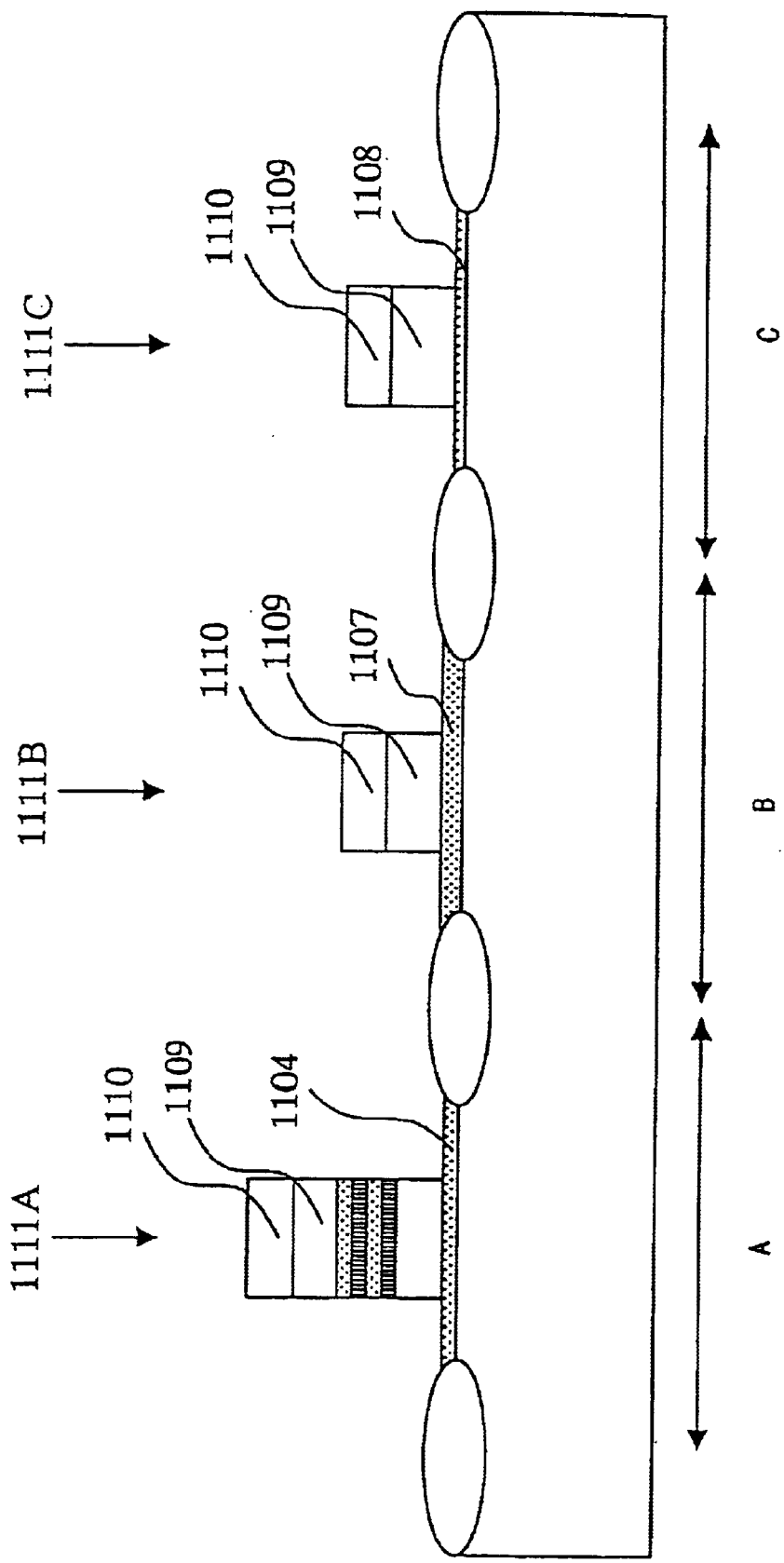

Next, in the step of FIG. 24, an ion implantation process is conducted into the high-voltage transistor region B and further into the low-voltage transistor region C for the purpose of threshold control. Thereafter, the oxide film 1103 is removed from the foregoing regions B and C, and a gate oxide film 1107 is formed on the high-voltage transistor region B with a thickness of 7 nm, followed by the formation of a gate oxide film 1108 on the low-voltage transistor region C with a thickness of 3.5 nm.

In the step of FIG. 24, the overall structure including the field oxide film 1102 is covered consecutively with a second polysilicon film 1109 and a silicide film 1110. By patterning the polysilicon film 1109 and the silicide film 1110, a gate electrode 1111B is formed in the high-voltage transistor region B and a gate electrode 1111C is formed in the low-voltage transistor region C. Further, the polysilicon film 1109 and the silicide film 110 are patterned in the memory cell region, and a gate electrode 1111A is formed.

Finally, a standard semiconductor process including formation of source and drain regions, formation of insulation films, formation of contact holes and formation of interconnections, is conducted, and the semiconductor device is completed.

It should be noted that the silicon oxide film and the silicon nitride film in the NONO film 1101 thus formed shows excellent electric properties in spite of the fact that the each of the silicon oxide and silicon nitride films therein has a very small thickness. Further, the silicon oxide film and the silicon nitride film are dense and have a feature of high film quality. As the silicon oxide film and the silicon nitride film are formed at low temperature, there occurs no problem of thermal budget formation, and the like, at the interface between the gate polysilicon and the oxide film, and an excellent interface is obtained.

In the flash memory integrated circuit device in which the flash memory devices of the present invention are arranged in a two-dimensional array, it becomes possible to carry out writing and erasing of information at low voltage. Further, the semiconductor integrated circuit has advantageous features of suppressing substrate current and suppressing degradation of the tunneling insulation film. Thus, the semiconductor integrated circuit has a reliable device characteristic. The flash memory device of the present invention is characterized by a low leakage current, and enables writing of information at a voltage of about 7 V. Further, the flash memory device of the present invention can retain the written information over a duration longer than a conventional flash memory device by a factor of 10. The number of times the rewriting can be made is increased also by a factor of 10 in the case of the flash memory of the present invention over a conventional flash memory device.

[Twelfth Embodiment]

Next, a flash memory device according to a fifth embodiment of the present invention will be described, wherein the flash memory device of the present embodiment has a gate electrode having a polysilicon/silicide stacked structure and is formed by using the art of low-temperature formation of oxide and nitride film that uses the high density microwave plasma explained before.

Figure 25:
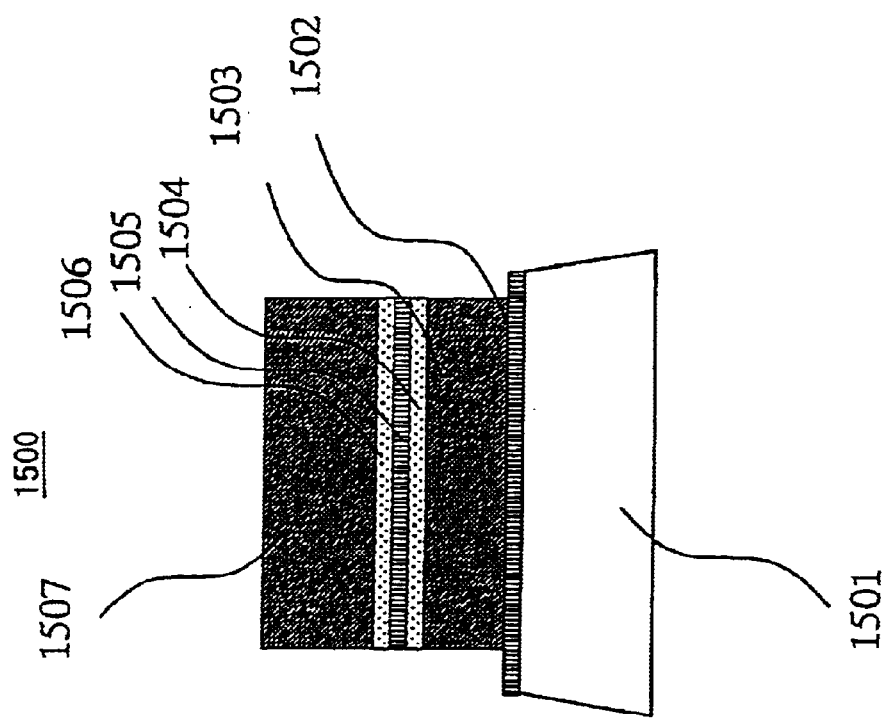
FIG. 25 is a diagram showing the cross-section of a flash memory device according to a thirteenth embodiment of the present invention.

FIG. 25 shows a schematic cross-sectional structure of a flash memory device 1500 according to the present embodiment.

Referring to FIG. 25, the flash memory device 1500 is constructed on a silicon substrate 1501 and includes a tunneling nitride film 1502 formed on the silicon substrate 1501 and a first polysilicon gate electrode 1503 formed on the tunneling nitride film 1502 as a floating gate electrode, wherein the first polysilicon gate electrode 1503 is covered consecutively by a silicon oxide film 1504, a silicon nitride film 1505 and a silicon oxide film 1506. Further, a second polysilicon electrode 1507 forming a control gate electrode is formed on the silicon oxide film 1506. In FIG. 25, illustration of source region, drain region, contact holes, interconnection patterns, and the like, is omitted.

In the flash memory device 1500 of FIG. 25, the silicon oxide films 1502, 1504 and 1506 are formed according to a process of forming a silicon oxide film that uses the high density microwave plasma explained before. Further, the silicon nitride film 1505 is formed by a process of forming a silicon nitride film that uses the high density microwave plasma explained before.

Next, the fabrication process of a flash memory integrated circuit of the present invention will be described.

In the present embodiment, too, the process steps up to the step of patterning the first polysilicon film 1503 are identical with those of the steps of FIGS. 21 and 22, except for the point that the tunneling nitride film 1502 is formed after the step of evacuating the vacuum vessel (processing chamber) 101, by introducing an Ar gas, an $N_2$ gas and an $H_2$ gas from the shower plate 102 such that the pressure inside the processing chamber becomes 100 mTorr (about 13 Pa). Thereby, the tunneling nitride film 1502 is formed to have a thickness of about 4 nm, by supplying a microwave of 2.45 GHz to form high density plasma in the processing chamber.

After the first polysilicon film 1503 is thus formed, the lower silicon oxide film 1504 and the silicon nitride film 1505 and the upper silicon oxide film 1506 are formed consecutively on the first polysilicon film, and an insulation film having an ONO structure is obtained.

Figure 1:
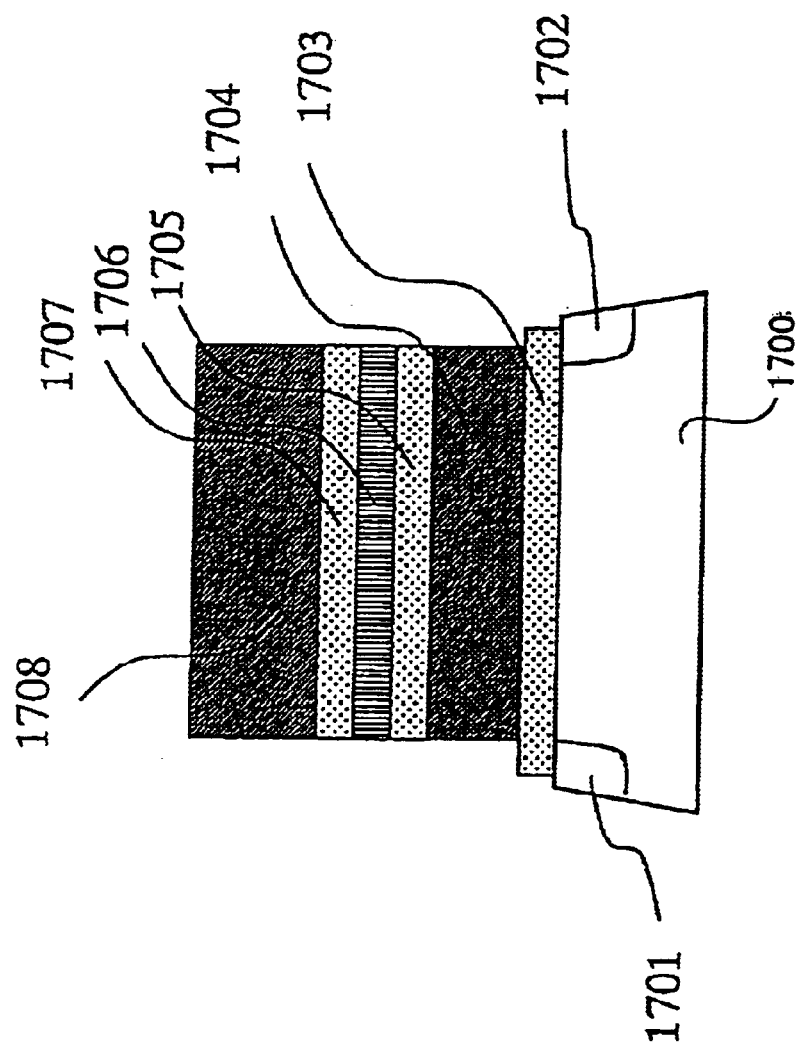
FIG. 1 is a cross-sectional diagram showing a schematic cross-section of a conventional flash memory device.

In more detail, the vacuum chamber (processing chamber) 101 of the microwave plasma processing apparatus explained previously with reference to FIG. 1 is evacuated to a high vacuum state, and the Kr gas and an $O_2$ gas are introduced into the processing chamber via the shower plate 102 such that the pressure of the processing chamber 101 is set to 1 Torr (about 133 Pa). In this state, the microwave of 2.45 GHz is supplied to the processing chamber 101 and there is formed the high density plasma therein. As a result, a silicon oxide film having a thickness of about 2 nm is formed on the surface of the first polysilicon film 1503.

Next, a silicon nitride film is formed on the silicon oxide film by a CVD process with a thickness of 3 nm, and the vacuum vessel (processing chamber) 101 is evacuated. Further, the Ar gas, the $N_2$ gas and the $H_2$ gas are introduced into the processing chamber via the shower plate 102, and the pressure inside the processing chamber is set to 1 Torr (about 133 Pa). In this state, the microwave of 2.45 GHz is supplied again and the high density plasma is formed in the processing chamber 101. By exposing the foregoing silicon nitride film to the hydrogen nitride radicals NH* formed with the high density plasma, the silicon nitride film is converted to a dense silicon nitride film.

Next, a silicon oxide film is formed on the foregoing dense silicon nitride film by a CVD process with a thickness of about 2 nm, and the pressure of the processing chamber 101 of the microwave plasma processing apparatus is set to 1 Torr (about 133 Pa) by supplying thereto the Kr gas and the $O_2$ gas. By supplying the microwave of 2.45 GHz further to the processing chamber in this state, the high density plasma is formed in the processing chamber 101. Thereby, the CVD oxide film formed previously in the CVD process is converted to a dense silicon oxide film by exposing to the atomic state oxygen O* formed with the high density plasma.

Thus, an ONO film is formed on the polysilicon film 1503 with a thickness of about 7 nm. The ONO film thus formed shows no dependence of property thereon on the orientation of the polysilicon surface on which the ONO film is formed and has an extremely uniform thickness. The ONO film thus formed is then subjected to a patterning process for removing a part thereof corresponding to the high-voltage transistor region B and the low-voltage transistor region C. By further applying the process steps similar to those used in the fourth embodiment before, the device fabrication process is completed.

The flash memory device thus formed has an excellent leakage characteristic characterized by low leakage current, and writing and reading operation can be conducted at the voltage of about 6 V. Further, the flash memory device provides a memory retention time larger by the factor of 10 over the conventional flash memory devices, similarly to the flash memory device 1000 of the previous embodiment. Further, it is possible to achieve the number of rewriting operations larger by the factor of 10 over the conventional flash memory devices.

[Thirteenth Embodiment]

Next, a description will be made on a flash memory device 1600 according to a thirteenth embodiment of the present invention, wherein the flash memory device 1600 has a gate electrode of polysilicon/silicide stacked structure and is formed by the process that uses the microwave high density plasma for forming low temperature oxide and nitride films.

Figure 26:
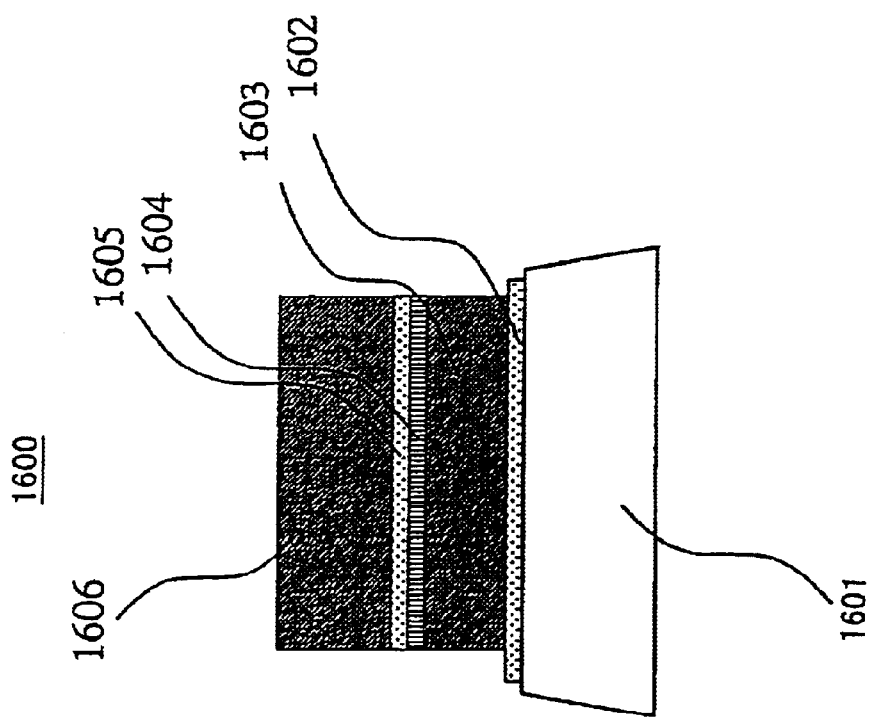
FIG. 26 is a diagram showing the cross-section of a flash memory device according to a fourteenth embodiment of the present invention.

FIG. 26 shows the schematic cross-sectional structure of the flash memory device 1600.

Referring to FIG. 26, the flash memory device 1600 is constructed on a silicon substrate 1601 and includes a tunneling oxide film 1602 formed on the silicon substrate 1061 and a first polysilicon gate electrode 1603 formed on the tunneling oxide film 1602, wherein the first polysilicon gate electrode 1603 is covered consecutively by a silicon nitride film 1604 and a silicon oxide film 1605. Further, a second polysilicon gate electrode 1606 is formed on the silicon oxide film 1605 as a control gate electrode.

In FIG. 26, illustration of source region, drain region, contact holes, and interconnection patterns, is omitted.

In the flash memory 1600 of FIG. 26, the silicon oxide films 1602 and 1605 are formed by the film forming process of oxide film explained above, while the silicon nitride film 1604 is formed by the film forming process of nitride film also explained above.

Next, the fabrication process of a flash memory integrated circuit according to the present invention will be explained.

In the present embodiment, too, the process proceeds similarly to the previous embodiments up to the step of patterning the first polysilicon film 1603, and the first polysilicon film 1603 is formed in the region A. Thereafter, an insulation film having an NO structure is formed by consecutively depositing a silicon nitride film and a silicon oxide film on the first polysilicon film 1603.

In more detail, the NO film is formed by using the microwave plasma processing apparatus of FIG. 2 according to the process steps noted below.

First, the vacuum vessel (processing chamber) 101 is evacuated, and a Kr gas, an N2 gas and an H2 gas are introduced thereto via the shower plate 102 and the pressure inside the processing chamber is set to about 100 mTorr (about 13 Pa). In this state, a microwave of 2.45 GHz is supplied, and high density plasma is induced in the processing chamber. Thereby, there occurs a nitriding reaction in the polysilicon film 1603 and a silicon nitride film is formed with a thickness of about 3 nm.

Next, a silicon oxide film is formed by a CVD process to a thickness of about 2 nm, and a Kr gas and an O$_2$ gas are introduced in the microwave plasma processing apparatus such that the pressure inside the processing chamber is set to about 1 Torr (about 133 Pa). In this sate, a microwave of 2.45 GHz frequency is supplied to form high density plasma in the processing chamber, such that the oxide film formed by the CVD process is exposed to the atomic state oxygen O* associated with the high density plasma. As a result, the CVD oxide film is converted to a dense silicon oxide film.

The NO film is thus formed to a thickness of about 5 nm, wherein the NO film thus formed has an extremely uniform thickness irrespective of the surface orientation of the polysilicon crystals. The NO film thus formed is then subjected to a patterning process and the part thereof covering the high-voltage transistor region B and the low-voltage transistor region C are removed selectively.

After the foregoing process, the process steps similar to those of FIG. 24 are conducted and the device fabrication process is completed.

The flash memory device thus formed has a low leakage characteristic, and enables writing or erasing at a low voltage as low as 5 V. Further, the flash memory device provides a memory retention time larger than the conventional memory retention time by a factor of 10, and rewriting cycles larger than the conventional rewriting cycles by a factor of 10.

The fabrication process of the memory cell, the high-voltage transistor and the low-voltage transistor merely represents an example, and the inventions are not limited to the embodiments described above. For example, it is possible to use an Ar gas in place of the Kr gas during the formation process of the nitride film. Further, it is possible to use a film having a stacked structure of polysilicon/silicide/polysilicon/refractory metal/amorphous silicon or polysilicon, for the first and second polysilicon films.

Further, it is also possible to use another plasma processing apparatus in place of the microwave plasma processing apparatus of FIG. 2 for forming the oxide film or nitride film of the present invention, as long as the plasma processing apparatus enables low temperature formation of an oxide film. Further, the radial line slot antenna is not the only solution for introducing a microwave into the processing chamber of the plasma processing apparatus, and the microwave may be introduced by other means.

In place of the microwave plasma processing apparatus of FIG. 2, it is also possible to use a plasma processing apparatus having a two-stage shower plate construction, in which the plasma gas such as the Kr gas or Ar gas is introduced from a first shower plate and the processing gas is introduced from a second shower plate different from the first shower plate. In this case, it is also possible to introduce the oxygen gas from the second shower plate. Further, it is possible to design the process such that the floating gate electrode of the flash memory device and the gate electrode of the high-voltage transistor are formed simultaneously by the first polysilicon electrode.

The claimed inventions are not limited to the embodiments described heretofore, but various variations and modifications may be made without departing from the scope of the invention.

According to the inventions, the dangling bonds or weak bonds are terminated by processing an oxide film or a nitride film or an oxynitride film formed on the substrate by atomic state oxygen O* or hydrogen nitride radicals NH* that associate with plasma that uses Kr or Ar as an inert gas. As a result, it becomes possible to improve the film quality even in the case of an insulation film of poor quality such as the one formed by a CVD process.

What is claimed is:

1. A method of forming an oxide film comprising:
   forming an oxide film on a substrate; and
   modifying a film quality of said oxide film formed on said substrate by exposing said oxide film to atomic state oxygen O*;
   wherein said step of modifying said film quality comprises exciting plasma in a mixed gas of Kr or Ar and oxygen, and exposing said oxide film to said plasma.

2. A method of forming an oxide film according to claim 1 wherein said modifying said film quality is conducted at a substrate temperature of 550° C. or less.

3. A method of forming a gate insulation film on a substrate, comprising:
   forming an oxynitride film on a substrate;
   processing said oxynitride film by hydrogen nitride radicals NH* and atomic state oxygen O*;
   depositing a high dielectric film on said processed oxynitride film; and
   forming a nitride film by processing a surface of said high dielectric film by hydrogen nitride radicals NH*.

4. A method of forming a nitride film, comprising:

forming a nitride film on a substrate; and modifying a film quality of said nitride film formed on said substrate by exposing said nitride film to hydrogen nitride radicals NH*.

5. A method of forming a nitride film according to claim 4, wherein said modifying said film quality comprises exciting plasma in a mixed gas of a Kr or Ar gas and a gas containing nitrogen and hydrogen by a microwave, and exposing said nitride film to said plasma.

6. A method of forming a nitride film according to claim 4, wherein said step of modifying said film quality is conducted at a substrate temperature of 550° C. or less.

7. A method of forming an oxide film, comprising:

forming plasma in a processing chamber by introducing an inert gas of Kr or Ar and an oxygen gas into said processing chamber and causing microwave excitation therein; and causing a deposition of an oxide film on a substrate in said processing chamber by introducing a processing gas into said processing chamber and by causing activation of said processing gas by said plasma, said oxide film being processed by atomic state oxygen O* formed in said plasma simultaneously with deposition.

8. A method of forming a nitride film comprising:

forming plasma in a processing chamber by introducing thereto an inert gas of Kr or Ar and a gas containing nitrogen and hydrogen and causing microwave excitation therein; and depositing a nitride film on a substrate in said processing chamber by introducing a processing gas into said processing chamber and by causing activation of said processing gas by said plasma, said nitride film being processed by hydrogen nitride radicals NH* in said plasma simultaneously with deposition.

9. A method of forming an oxynitride film, comprising:

forming plasma in a processing chamber by introducing an inert gas of Kr or Ar, an oxygen gas, and a gas containing nitrogen and hydrogen into said processing chamber and causing microwave excitation therein;

depositing an oxynitride film on a substrate by introducing a processing gas into said processing chamber and by causing activation of said processing gas by said plasma, said oxynitride film being processed by atomic state oxygen and hydrogen nitride radicals formed in said plasma simultaneously with deposition.

10. A method of sputtering an oxide film, comprising:

depositing an oxide film on a substrate in a processing chamber by a sputtering of a target;

forming plasma in said processing chamber by causing microwave excitation of an inert gas of Kr or Ar and an oxygen gas; and processing said oxide film by atomic state oxygen O* formed in said plasma.

11. A sputtering method of a nitride film, comprising:

depositing a nitride film on a substrate in a processing chamber by a sputtering of a target;

forming plasma in said processing chamber by microwave excitation of an inert gas of Kr or Ar and a gas containing nitrogen and hydrogen; and processing said nitride film by hydrogen nitride radicals formed in said plasma.

12. A sputtering method of an oxynitride film, comprising:

depositing an oxynitride film on a substrate by a sputtering of a target;

forming plasma in said processing chamber by microwave excitation of an inert gas of Kr or Ar and an oxygen gas and a gas containing nitrogen and hydrogen; and processing said oxynitride film by atomic state oxygen O* and hydrogen nitride radicals NH* formed in said plasma.

13. A method of forming a gate insulation film on a substrate, comprising:

forming a nitride film on a surface of a substrate;

processing said nitride film by hydrogen nitride radicals NH*;

depositing a high dielectric film on said processed nitride film; and forming a nitride film by processing a surface of said high dielectric film by hydrogen nitride radicals NH*.

* * * * *

UNITED STATES PATENT AND TRADEMARK OFFICE
CERTIFICATE OF CORRECTION

PATENT NO. : 6,669,825 B2
DATED : December 30, 2003
INVENTOR(S) : Tadahiro Ohmi et al.

It is certified that error appears in the above-identified patent and that said Letters Patent is hereby corrected as shown below:

<u>Title page,</u>
Insert Item:

-- [30]    Foreign Application Priority Data

Mar. 13, 2000    (JP)    2000-115940 --

Signed and Sealed this

Twenty-fifth Day of May, 2004

JON W. DUDAS
*Acting Director of the United States Patent and Trademark Office*